(12) United States Patent
Lai et al.

(10) Patent No.: US 12,009,362 B2
(45) Date of Patent: Jun. 11, 2024

(54) METHOD OF MAKING amphi-FET STRUCTURE AND METHOD OF DESIGNING

(71) Applicant: TAIWAN SEMICONDUCTOR MANUFACTURING COMPANY, LTD., Hsinchu (TW)

(72) Inventors: Chih-Yu Lai, Hsinchu (TW); Chih-Liang Chen, Hsinchu (TW); Chi-Yu Lu, Hsinchu (TW); Shang-Syuan Ciou, Hsinchu (TW); Hui-Zhong Zhuang, Hsinchu (TW); Ching-Wei Tsai, Hsinchu (TW); Shang-Wen Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/360,539

(22) Filed: Jul. 27, 2023

(65) Prior Publication Data
US 2024/0021606 A1 Jan. 18, 2024

Related U.S. Application Data

(62) Division of application No. 17/214,194, filed on Mar. 26, 2021, now Pat. No. 11,764,213.

(51) Int. Cl.
*H01L 27/06* (2006.01)
*G06F 30/392* (2020.01)
(Continued)

(52) U.S. Cl.
CPC ........ *H01L 27/0694* (2013.01); *G06F 30/392* (2020.01); *G06F 30/394* (2020.01);
(Continued)

(58) Field of Classification Search
CPC ............. H01L 27/0694; H01L 21/0259; H01L 21/76898; H01L 21/8221; H01L 21/823412; H01L 21/823475; H01L 23/481; H01L 23/5283; H01L 29/0665; H01L 29/41733; H01L 29/42392; H01L 29/66742; H01L 29/78696; H01L 29/0673;
(Continued)

(56) References Cited

U.S. PATENT DOCUMENTS 7,260,442 B2   8/2007   Hwang et al.
9,256,709 B2   2/2016   Yu et al.
(Continued)

*Primary Examiner* — Jonathan Han
(74) *Attorney, Agent, or Firm* — Hauptman Ham, LLP

(57) ABSTRACT

A method of making a semiconductor device includes forming a first active region on a first side of a substrate. The method further includes forming a first source/drain (S/D) electrode surrounding a first portion of the first active region. The method further includes forming an S/D connect via extending through the substrate. The method further includes flipping the substrate. The method further includes forming a second active region on a second side of the substrate, wherein the second side of the substrate is opposite to the first side of the substrate. The method further includes forming a second S/D electrode surrounding a first portion of the second active region, wherein the S/D connect directly contacts both the first S/D electrode and the second S/D electrode.

20 Claims, 19 Drawing Sheets

(51) Int. Cl.
    *G06F 30/394*    (2020.01)
    *H01L 21/02*    (2006.01)
    *H01L 21/768*    (2006.01)
    *H01L 21/822*    (2006.01)
    *H01L 21/8234*    (2006.01)
    *H01L 23/48*    (2006.01)
    *H01L 23/528*    (2006.01)
    *H01L 29/06*    (2006.01)
    *H01L 29/417*    (2006.01)
    *H01L 29/423*    (2006.01)
    *H01L 29/66*    (2006.01)
    *H01L 29/786*    (2006.01)

(52) U.S. Cl.
    CPC .... *H01L 21/0259* (2013.01); *H01L 21/76898* (2013.01); *H01L 21/8221* (2013.01); *H01L 21/823412* (2013.01); *H01L 21/823475* (2013.01); *H01L 23/481* (2013.01); *H01L 23/5283* (2013.01); *H01L 29/0665* (2013.01); *H01L 29/41733* (2013.01); *H01L 29/42392* (2013.01); *H01L 29/66742* (2013.01); *H01L 29/78696* (2013.01)

(58) Field of Classification Search
    CPC . H01L 29/775; H01L 23/528; H01L 23/5286; H01L 27/088; H01L 21/823431; H01L 21/823821; H01L 21/823871; H01L 27/0886; H01L 27/092; H01L 27/0922; H01L 27/0924; H01L 27/3262; H01L 27/1218; H01L 27/1225; H01L 27/1251; H01L 27/3276; H01L 27/1255; H01L 27/323; H01L 29/78675; H01L 29/7869; H01L 2224/16225; H01L 27/124; H01L 27/3258; G06F 30/392; G06F 30/394; G06F 30/398; B82Y 10/00; G02F 1/136286; G02F 1/136227
    USPC ....... 257/223, 227, 291, 292, 439, 443, 655, 257/E27.1, E27.125, E27.112, E29.117, 257/E29.145, E29.147, E29.151, E29.182, 257/E29.202, E29.273, E29.299, E29.314, 257/E29.32, E23.016
    See application file for complete search history.

(56) References Cited

U.S. PATENT DOCUMENTS

| | | | |
|---|---|---|---|
| 10,504,982 B2 * | 12/2019 | Lee | H10K 59/1213 |
| 2014/0027764 A1 * | 1/2014 | Yamazaki | H01L 27/0688 257/43 |
| 2014/0040838 A1 | 2/2014 | Liu et al. | |
| 2015/0278429 A1 | 10/2015 | Chang | |

* cited by examiner

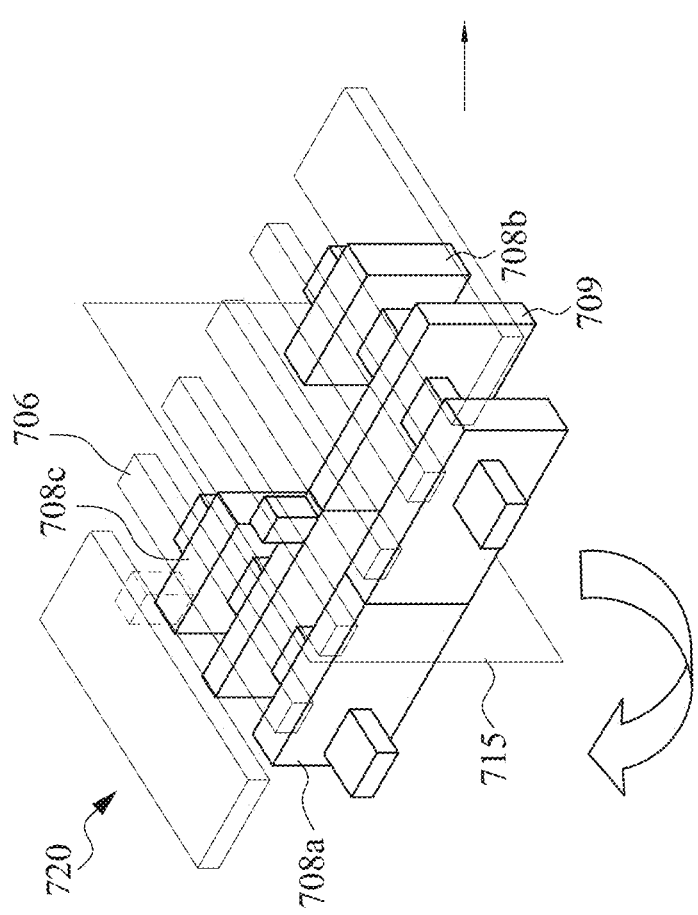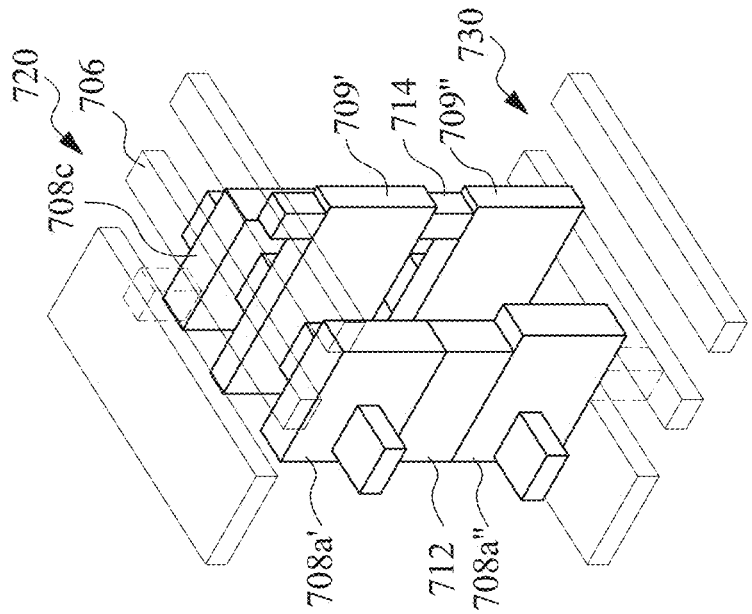
Fig. 7B

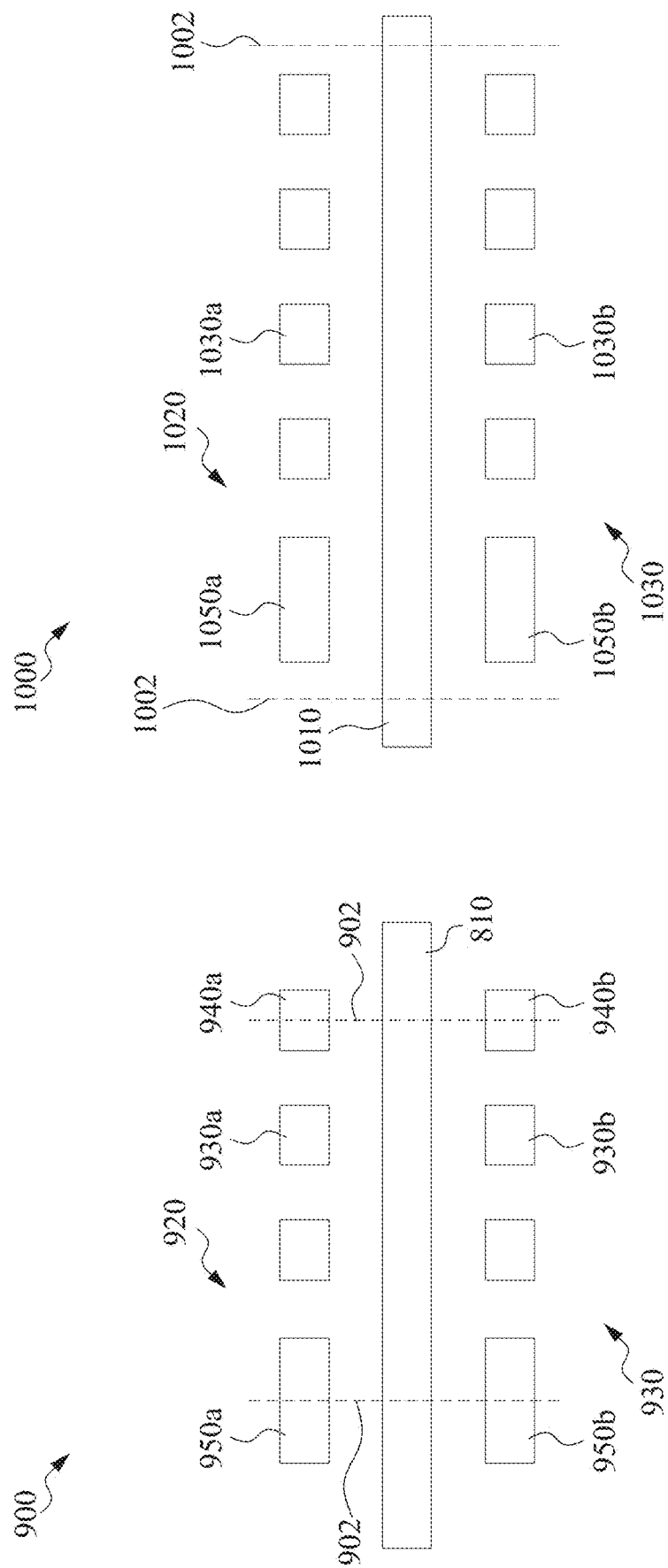

METHOD OF MAKING amphi-FET STRUCTURE AND METHOD OF DESIGNING

RELATED APPLICATIONS

This application is a divisional of U.S. application Ser. No. 17/214,194, filed Mar. 26, 2021, which is incorporated herein by reference in its entirety.

BACKGROUND

As technology nodes continue to shrink routing for interconnect structures becomes more difficult. Three dimensional integrated circuits (3DICs) involve stacking devices in a vertical direction and electrically connecting the devices together, for example, using a through silicon via (TSV). In a 3DIC structure, a device is formed on one side of a substrate. The 3DIC reduces an area for the IC in a planar direction.

In another approach, interconnect structures, such as routing lines and power lines are formed on one side of a substrate and connected to a device on an opposite side of the substrate, for example using a TSV. The interconnect structures on an opposite side of the substrate from the device increases an area usable for routing, which increases routing options and reduces an area of the IC in the planar direction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7B is perspective views of a FET structure converted into an amphi-FET structure, in accordance with some embodiments.

FIG. 9 is a view of a layout of an amphi-FET structure, in accordance with some embodiments.

FIG. 10 is a view of a layout of an amphi-FET structure, in accordance with some embodiments.

DETAILED DESCRIPTION

Figure 1:
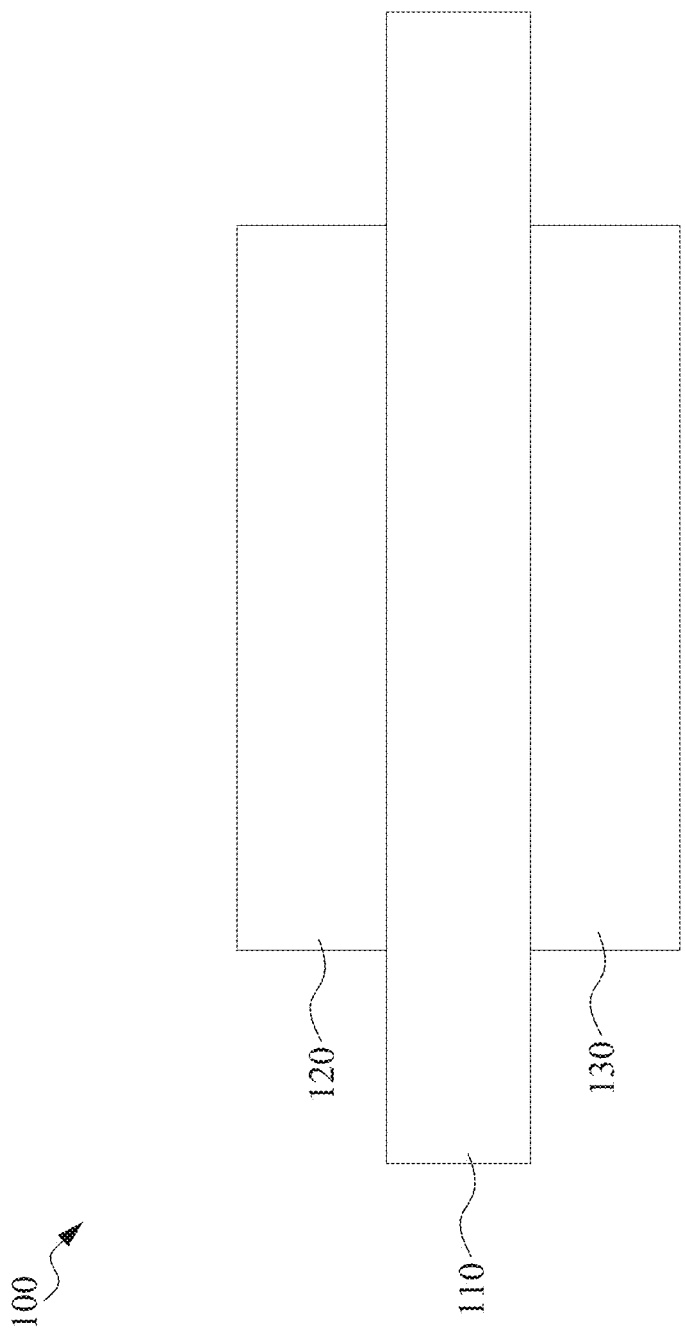
FIG. 1 is a cross-sectional view of an amphi-FET, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As technology nodes continue to shrink, three dimensional integrated circuits (3DICs), fin field effect transistors (FinFETs), gate all around (GAA) transistors, and backside routing structures alone are unable to keep up with the demand for reduced device area. Amphi-field effect transistors (amphi-FETs) are usable to improve routing options for interconnect structures, which permits further device size reduction. An amphi-FET includes active devices formed on both sides of a substrate. In contrast, a 3DIC includes two devices formed on separate substrates; and the separate substrates are then bonded together. The improved routing options in an amphi-FET means that increasing device size unnecessarily to accommodate connections between elements in the device is reduced or avoided.

The active devices in the amphi-FET are electrically connected using conductive elements extending through the substrate. For example, a gate structure on a first side of the substrate is electrically connected to a gate structure on a second side of the substrate by a gate via extending through the substrate. Similarly, a source/drain (S/D) contact on the first side of the substrate is electrically connected to an S/D contact on the second side of the substrate by an S/D connect via extending through the substrate. Due to these connections through the substrate, a signal, such as a power signal applied on one side of the substrate is able to transfer to the other side of the substrate without including additional routing or through substrate via (TSV) structures. For example, a ground signal connected to an S/D contact on the first side of the substrate is transferred to the second side of the substrate by the S/D connect via to the S/D contact on the second side of the substrate. The ground voltage is then usable on the second side of the substrate without providing a power rail for the ground voltage (or a TSV structure) on the second side of the substrate.

Integrated circuits (ICs) are often designed using cells, which include active devices and connection structures in order to implement an intended function. In some embodiments, a cell includes a single active device. In some embodiments, a cell includes multiple active devices. The ability to efficiently share signals and power from one side of the substrate to the other side of the substrate makes more routing tracks in a cell available for routing signals within the cell and into and out of the cell. Thus, a size of the cell is not unnecessarily increased merely to provide sufficient connections for the cell to function properly. In some instances, a gate density of a device including amphi-FETs is greater than 1.5 times a gate density of a device including active devices on a single side of the substrate. Gate density is a measure of how closely gate structures in a cell are spaced from one another. Gate density is commonly used to describe how efficiently the space within the cell is utilized. Increasing the cell size merely to provide routing options reduces gate density. In some instances, the gate density increase due to the use of amphi-FETs is more than 1.6 times the gate density of a device including active devices on a single side of the substrate.

This significant size reduction helps to keep pace with Moore's Law and also helps with reduced power consumption and increased device speed. The reduced power consumption is a result of having shorter distances between elements, so less power is lost to resistance and heating of conductive lines and vias in the amphi-FET device. The increased device speed results from being able to increase a size of active regions of the cell because less space within the cell is occupied by interconnect elements.

FIG. 1 is a cross-sectional view of an amphi-FET 100 in accordance with some embodiments. The amphi-FET 100 includes a substrate 110. A first cell 120 is on a first side of the substrate 110. A second cell 130 is on a second side of the substrate 110 opposite to the first side. The first cell 120 is electrically connected to the second cell 130 through the substrate 110, as discussed below. In some embodiments, the first cell 120 has a same functionality as the second cell 130. In some embodiments, the first cell 120 has a different functionality from the second cell 130. In some embodiments, the first cell 120 and the second cell 130 combine to implement a designed functionality. One of ordinary skill in the art will recognize that two cells are included in FIG. 1 as an example, and that the current description is not limited to merely two cells.

Figure 2:
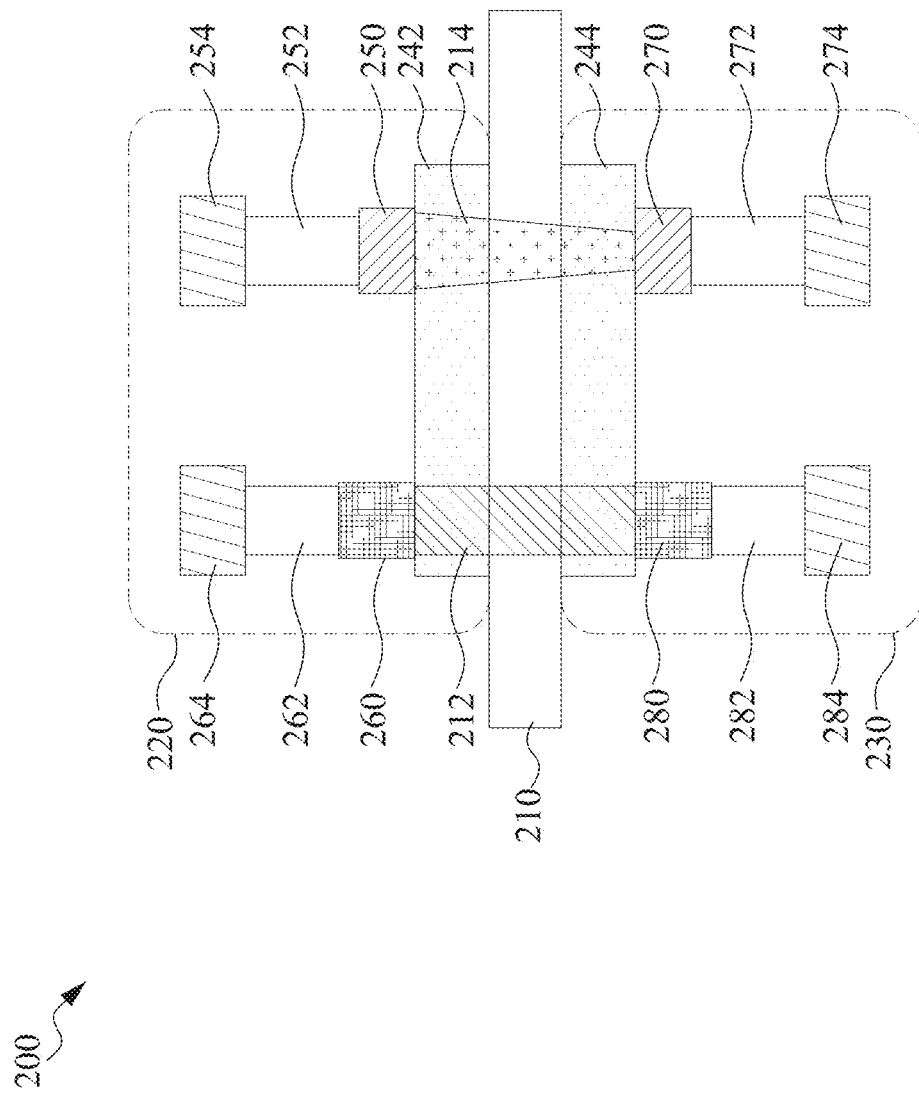
FIG. 2 is a cross-sectional view of an amphi-FET, in accordance with some embodiments.

FIG. 2 is a cross-sectional view of an amphi-FET 200 in accordance with some embodiments. In some embodiments, the amphi-FET 200 is a more detailed view of the amphi-FET 100 (FIG. 1). The amphi-FET 200 includes a substrate 210. A first cell 220 is on a first side of the substrate 210 and a second cell 230 is on a second side of the substrate 210 opposite to the first side. The first cell 220 is connected to the second cell 230 by an S/D connect via 212 extending through the substrate 210, and by a gate via 214 extending through the substrate 210. The S/D connect via 212 has parallel sidewalls and a substantially uniform width. The gate via 214 has a tapered profile. In some embodiments, the S/D connect via 212 has a tapered profile. In some embodiments, the gate via 214 has parallel sidewalls and a substantially uniform width. One of ordinary skill in the art would recognize that any combination of shapes for the S/D connect via 212 and the gate via 214 is within the scope of this description.

The first cell 220 includes a first active region 242. In some embodiments, the first active region 242 includes nanosheets (NS) for forming a gate all around (GAA) transistor. A first gate contact 250 is electrically connected to a gate structure associated with the first active region 242. A first via 252 electrically connects the first gate contact 250 to a first conductive line 254 of a first side interconnect structure. In some embodiments, the first conductive line 254 is usable to carry a signal or power to the gate structure in the first active region 242 through the first via 252 and the first gate contact 250.

The first cell 220 further includes a first S/D contact 260 electrically connected to an S/D electrode associated with the first active region 242. A second via 262 electrically connects the first S/D contact 260 to a second conductive line 264 of the first side interconnect structure. In some embodiments, the second conductive line 264 is usable to carry a signal or power to the S/D electrode in the first active region 242 through the second via 262 and the first S/D contact 260.

The second cell 230 includes a second active region 244. In some embodiments, the second active region 244 includes NS for forming a GAA transistor. A second gate contact 270 is electrically connected to a gate structure associated with the second active region 244. A third via 272 electrically connects the second gate contact 270 to a third conductive line 274 of a second side interconnect structure. In some embodiments, the third conductive line 274 is usable to carry a signal or power to the gate structure in the second active region 244 through the third via 272 and the second gate contact 270.

The second cell 230 further includes a second S/D contact 280 electrically connected to an S/D electrode associated with the second active region 244. A fourth via 282 electrically connects the second S/D contact 280 to a fourth conductive line 284 of the second side interconnect structure. In some embodiments, the fourth conductive line 284 is usable to carry a signal or power to the S/D electrode in the second active region 244 through the fourth via 282 and the second S/D contact 280.

The third conductive line 274 is electrically connected to the first conductive line 254 through the third via 272, the second gate contact 270, the gate structure in the second active region 244, the gate via 214, the gate structure in the first active region 242, the first gate contact 250 and the first via 252. This connection path is more direct than routing a connection path around the first active region 242 and the second active region 244. As a result, resistance of the amphi-FET 200 is reduced and a size of each of the first cell 220 and the second cell 230 is reduced in comparison with other structures that do not include the gate via 214.

The fourth conductive line 284 is electrically connected to the second conductive line 264 through the fourth via 282, the second S/D contact 280, the S/D electrode in the second active region 244, the S/D connect via 212, the S/D electrode in the first active region 242, the first S/D contact 260 and the second via 262. This connection path is more direct than routing a connection path around the first active region 242 and the second active region 244. As a result, resistance of the amphi-FET 200 is reduced and a size of each of the first cell 220 and the second cell 230 is reduced in comparison with other structures that do not include the S/D connect via 212.

In some embodiments, substrate 210 includes an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition changes from one ratio at one location to another ratio at another location of the gradient SiGe feature. In some embodiments, the alloy SiGe is formed over a silicon substrate. In some embodiments, substrate 210 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure or the substrate includes a multilayer compound semiconductor structure.

In some embodiments, a number of NS in the first active region 242 is equal to a number of NS in the second active region 244. In some embodiments, the number of NS in the first active region 242 is different from the number of NS in the second active region 244. In some embodiments, at least one of the first active region 242 or the second active region 244 includes a transistor structure different from a GAA transistor, such as a FinFET or metal-oxide-semiconductor FET (MOSFET). While the cross-sectional view of FIG. 2 includes the S/D connect via 212 and the gate via 214 extending through the first active region 242 and the second active region 244, the gate via 214 is not electrically shorted to the S/D connect via 212 by the first active region 242 or the second active region 244. One of ordinary skill in the art would recognize that the gate via 214 and the S/D connect via 212 electrically connect to portions of the first active region 242 and the second active region 244 as made clear by the description below.

In some embodiments, the S/D connect via 212 and the gate via 214 independently include a fill material including cobalt (Co), tungsten (W), copper (Cu), ruthenium (Ru), titanium (Ti), tantalum (Ta), or alloys thereof, or other conductive materials. In some embodiments, the S/D connect via 212 and the gate via 214 include a liner surrounding the fill material. In some embodiments, the liner includes titanium nitride (TiN), titanium (Ti), ruthenium (Ru), cobalt (Co), tantalum (Ta), tantalum nitride (TaN), or alloys thereof, or other liner materials. In some embodiments, a composition of the S/D connect via 212 is a same composition as the gate via 214. In some embodiments, the composition of the S/D connect via 212 is different from the composition of the gate via 214. In some embodiments, the S/D connect via 212 connects to the S/D electrode of the first active region 242 and the second active region 244 through a silicide layer (not shown). In some embodiments, the gate via 214 connects to the gate structure of the first active region 242 and the second active region 244 through a silicide layer (not shown).

In some embodiments, the first gate contact 250 and the second gate contact 270 independently include a fill material including cobalt (Co), tungsten (W), copper (Cu), ruthenium (Ru), titanium (Ti), tantalum (Ta), or alloys thereof, or other conductive materials. In some embodiments, the first gate contact 250 and the second gate contact 270 include a liner surrounding the fill material. In some embodiments, the liner includes titanium nitride (TiN), titanium (Ti), ruthenium (Ru), cobalt (Co), tantalum (Ta), tantalum nitride (TaN), or alloys thereof, or other liner materials. In some embodiments, a composition of the first gate contact 250 is a same composition as the second gate contact 270. In some embodiments, the composition of the first gate contact 250 is different from the composition of the second gate contact 270. In some embodiments, each of the first gate contact 250 and the second gate contact 270 have a same composition as both the S/D connect via 212 and the gate via 214. In some embodiments, at least one of the first gate contact 250 or the second gate contact 270 has a different composition from at least one of the S/D connect via 212 or the gate via 214. In some embodiments, the first gate contact 250 and the second gate contact 270 independently connect to the gate structure of the corresponding first active region 242 and the second active region 244, through a silicide layer (not shown).

In some embodiments, the first S/D contact 260 and the second S/D contact 280 independently include a fill material including cobalt (Co), tungsten (W), copper (Cu), ruthenium (Ru), titanium (Ti), tantalum (Ta), or alloys thereof, or other conductive materials. In some embodiments, the first S/D contact 260 and the second S/D contact 280 include a liner surrounding the fill material. In some embodiments, the liner includes titanium nitride (TiN), titanium (Ti), ruthenium (Ru), cobalt (Co), tantalum (Ta), tantalum nitride (TaN), or alloys thereof, or other liner materials. In some embodiments, a composition of the first S/D contact 260 is a same composition as the second S/D contact 280. In some embodiments, the composition of the first S/D contact 260 is different from the composition of the second S/D contact 280. In some embodiments, each of the first S/D contact 260 and the second S/D contact 280 have a same composition as the S/D connect via 212, the gate via 214, the first gate contact 250 and the second gate contact 270. In some embodiments, at least one of the first S/D contact 260 or the second S/D contact 280 has a different composition from at least one of the S/D connect via 212, the gate via 214, the first gate contact 250 or the second gate contact 270. In some embodiments, the first S/D contact 260 and the second S/D contact 280 independently connect to the S/D electrode of the first active region 242 and the second active region 244, respectively, through a silicide layer (not shown).

In some embodiments, the first via 252, the second via 262, the third via 272 and the fourth via 282 independently include a fill material including cobalt (Co), tungsten (W), copper (Cu), ruthenium (Ru), titanium (Ti), tantalum (Ta), or alloys thereof, or other conductive materials. In some embodiments, the first via 252, the second via 262, the third via 272 and the fourth via 282 include a liner surrounding the fill material. In some embodiments, the liner includes titanium nitride (TiN), titanium (Ti), ruthenium (Ru), cobalt (Co), tantalum (Ta), tantalum nitride (TaN), or alloys thereof, or other liner materials. In some embodiments, a composition of the first via 252 is a same composition as each of the second via 262, the third via 272 and the fourth via 282. In some embodiments, the composition of the first via 252 is different from the composition of at least one of the second via 262, the third via 272 or the fourth via 282. In some embodiments, each of the first via 252, the second via 272, the third via 272 and the fourth via 282 have a same composition as the S/D connect via 212, the gate via 214, the first gate contact 250, the second gate contact 270, the first S/D contact 260 and the second S/D contact 280. In some embodiments, at least one of the first via 252, the second via 262, the third via 272 or the fourth via 282 has a different composition from at least one of the S/D connect via 212, the gate via 214, the first gate contact 250, the second gate contact 270, the first S/D contact 260 or the second S/D contact 280.

In some embodiments, the first conductive line 254, the second conductive line 264, the third conductive line 274 and the fourth conductive line 284 independently include a fill material including cobalt (Co), tungsten (W), copper (Cu), ruthenium (Ru), titanium (Ti), tantalum (Ta), or alloys thereof, or other conductive materials. In some embodiments, the first conductive line 254, the second conductive line 264, the third conductive line 274 and the fourth conductive line 284 include a liner surrounding the fill material. In some embodiments, the liner includes titanium nitride (TiN), titanium (Ti), ruthenium (Ru), cobalt (Co), tantalum (Ta), tantalum nitride (TaN), or alloys thereof, or other liner material. In some embodiments, a composition of the first conductive line 254 is a same composition as each of the second conductive line 264, the third conductive line 274 and the fourth conductive line 284. In some embodiments, the composition of the first conductive line 254 is different from the composition of at least one of the second conductive line 264, the third conductive line 274 or the fourth conductive line 284. In some embodiments, each of the first conductive line 254, the second conductive line 264, the third conductive line 274 and the fourth conductive line 284 have a same composition as the S/D connect via 212, the gate via 214, the first gate contact 250, the second gate contact 270, the first S/D contact 260, the second S/D contact 280, the first via 252, the second via 262, the third via 272 and the fourth via 282. In some embodiments, at least one of the first conductive line 254, the second conductive line 264, the third conductive line 274 or the fourth conductive line 284 has a different composition from at least one of the S/D connect via 212, the gate via 214, the first gate contact 250, the second gate contact 270, the first S/D contact 260, the second S/D contact 280, the first via 252, the second via 262, the third via 272 or the fourth via 282.

Figure 3:
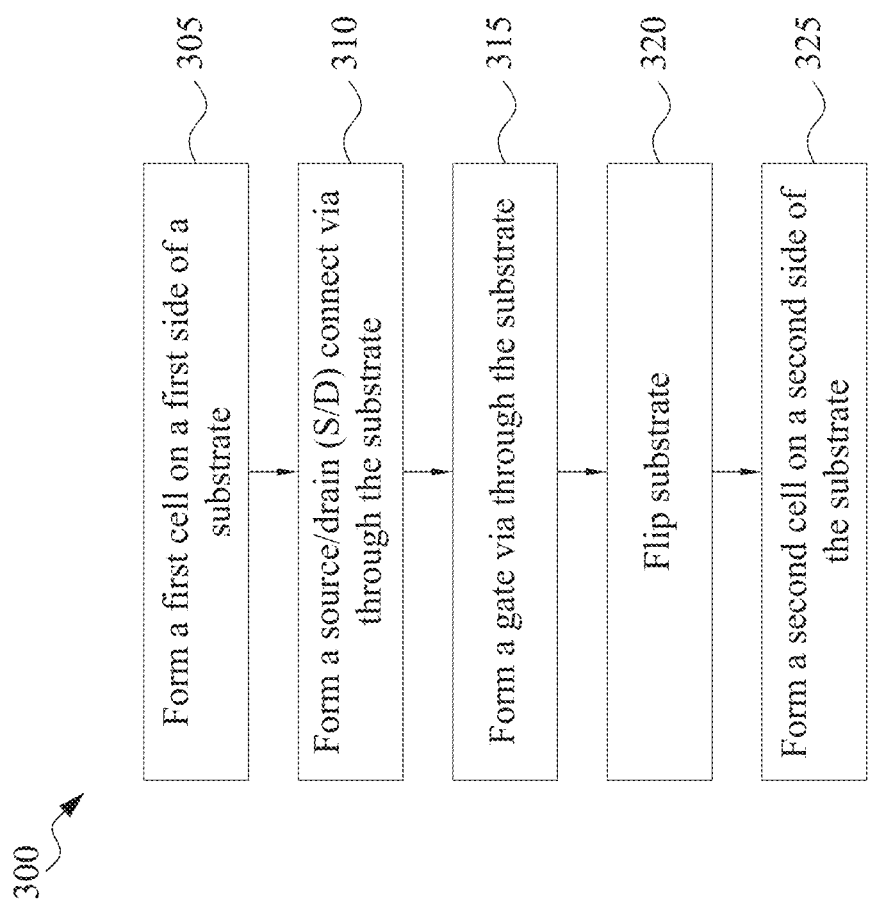
FIG. 3 is a flowchart of a method of making an amphi-FET, in accordance with some embodiments.

FIG. 3 is a flowchart of a method 300 of making an amphi-FET in accordance with some embodiments. The operations of the method 300 are able to be performed in a variety of sequences in order to produce the amphi-FET. Some possible variations will be discussed below.

Method 300 includes operation 305, in which a first cell is formed on a first side of substrate. The first cell is formed using a series of deposition and patterning processes. In some embodiments, the deposition processes include chemical vapor deposition (CVD), physical vapor deposition (PVD), atomic layer deposition (ALD), sputtering or another suitable deposition process. In some embodiments, the patterning processes include lithographic and etching processes, such as dry or wet etching. In some embodiments, the first cell includes NS and an interconnect structure, similar to the first cell 220 (FIG. 2).

In operation 310, an S/D connect via is formed through the substrate. The S/D connect via is formed by depositing a sacrificial layer, such as a dielectric layer over at least one side of the substrate. In some embodiments where the S/D connect via is formed after the first cell, the sacrificial layer is formed on a single side of the substrate. In some embodiments where the first cell is formed after the S/D connect via, the sacrificial layer is formed on both sides of the substrate. The sacrificial layer and the substrate are etched to form an opening extending through the substrate. In embodiments that include forming the first cell prior to forming the S/D connect via, the opening exposes a portion of an S/D electrode of the first cell. The opening is then filled by one or more deposition processes in order to form the S/D connect. In some embodiments, the deposition processes include CVD, PVD, ALD, sputtering or another suitable deposition process. In some embodiments, the S/D connect via is similar to the S/D connect via 212 (FIG. 2). In some embodiments, a removal process, such as etching or planarization is performed to remove material of the S/D connect via over a surface of the sacrificial layer farthest from the substrate. In some embodiments, the sacrificial layer is removed from at least one side of the substrate following formation of the S/D connect via.

In operation 315, a gate via is formed through the substrate. In some embodiments, the gate via is formed simultaneously with the formation of the S/D connect via. The gate via is formed by depositing a sacrificial layer, such as a dielectric layer over at least one side of the substrate. In some embodiments where the gate via is formed after the first cell, the sacrificial layer is formed on a single side of the substrate. In some embodiments where the first cell is formed after the gate via, the sacrificial layer is formed on both sides of the substrate. The sacrificial layer and the substrate are etched to form an opening extending through the substrate. In embodiments that include forming the first cell prior to forming the gate via, the opening exposes a portion of a gate structure of the first cell. The opening is then filled by one or more deposition processes in order to form the S/D connect. In some embodiments, the deposition processes include CVD, PVD, ALD, sputtering or another suitable deposition process. In some embodiments, the gate via is similar to the gate via 214 (FIG. 2). In some embodiments, a removal process, such as etching or planarization is performed to remove material of the gate via over a surface of the sacrificial layer farthest from the substrate. In some embodiments, the sacrificial layer is removed from at least one side of the substrate following formation of the gate via.

In operation 320, the substrate is flipped. In some embodiments, the substrate is flipped using a robot arm and/or a vacuum chuck. Flipping the substrate exposes a second side of the substrate for processes. In some embodiments where the S/D connect via and/or the gate via is formed after the first cell, the substrate is flipped prior to forming the S/D connect via and/or the gate via. In some embodiments wherein the S/D connect via and/or the gate via is formed prior to the first cell, the substrate is flipped after forming the first cell.

In operation 325, a second cell is formed on the second side of the substrate. The second cell is formed using a series of deposition and patterning processes. In some embodiments, the deposition processes include CVD, PVD, ALD, sputtering or another suitable deposition process. In some embodiments, the patterning processes include lithographic and etching processes, such as dry or wet etching. In some embodiments, the second cell includes NS and an interconnect structure, similar to the second cell 230 (FIG. 2). Forming the second cell includes forming an S/D electrode of the second cell electrically connected to the S/D connect via and forming a gate structure of the second cell electrically connected to the gate via. In some embodiments, a functionality of the first cell is a same functionality as the second cell. In some embodiments, the first cell has different functionality from the second cell. In some embodiments, the first cell and the second cell are used in combination to implement a designed functionality.

Figure 4:
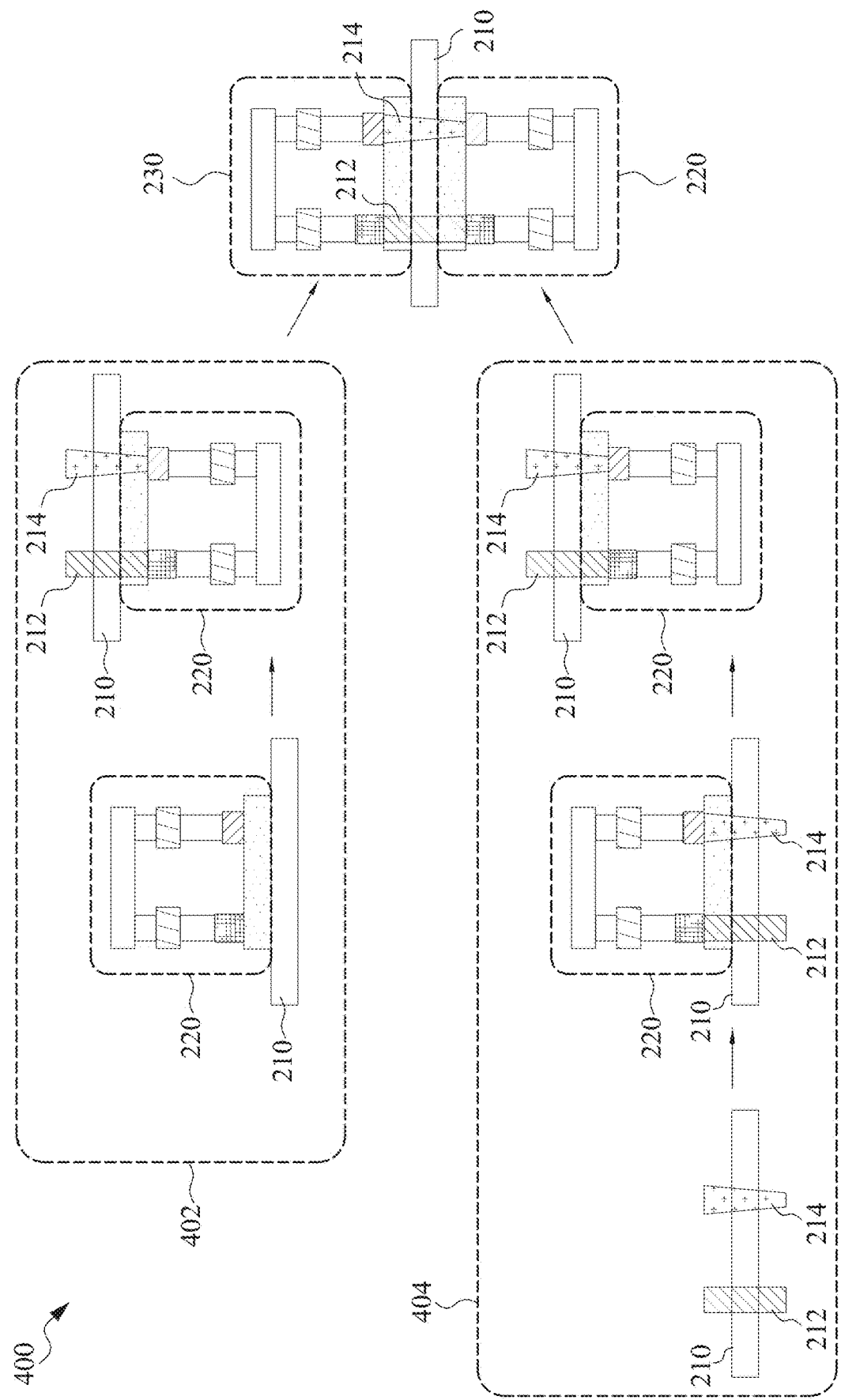
FIG. 4 is a series of cross-sectional views of an amphi-FET structure at various stages of manufacture, in accordance with some embodiments.

FIG. 4 is a series of cross-sectional views of an amphi-FET structure 400 at various stages of manufacture in accordance with some embodiments. FIG. 4 includes a first production track 402 and a second production track 404. Both the first production track 402 and the second production track 404 product a same final structure as indicated in FIG. 4.

In the first production track 402, the first cell 220 is formed on a first side of the substrate 210. The substrate 210 is then flipped and the S/D connect via 212 and the gate via 214 are formed to electrically connect to the first cell 220 through the substrate 210. The second cell 230 is then formed on the second side of the substrate 210 to electrically connect to the first cell 220 through the S/D connect via 212 and the gate via 214. In some embodiments, the first production track 402 is implemented by performing operations 305, 320, 310, 315 and 325 of method 300 (FIG. 3) in this order. In some embodiments, operations 310 and 315 are performed simultaneously.

In the second production track 404, the S/D connect via 212 and the gate via 214 are formed through the substrate 210. The first cell 220 is then formed on the first side of the substrate 210 to electrically connect to the S/D connect via 212 and the gate via 214. The substrate 210 is then flipped and the second cell 230 is formed on the second side of the substrate 210 to electrically connect to the first cell 220 through the S/D connect via 212 and the gate via 214. In some embodiments, the second production track 404 is implemented by performing operations 310, 315, 305, 320 and 325 of method 300 (FIG. 3) in this order. In some embodiments, operations 310 and 315 are performed simultaneously.

Figure 5A:
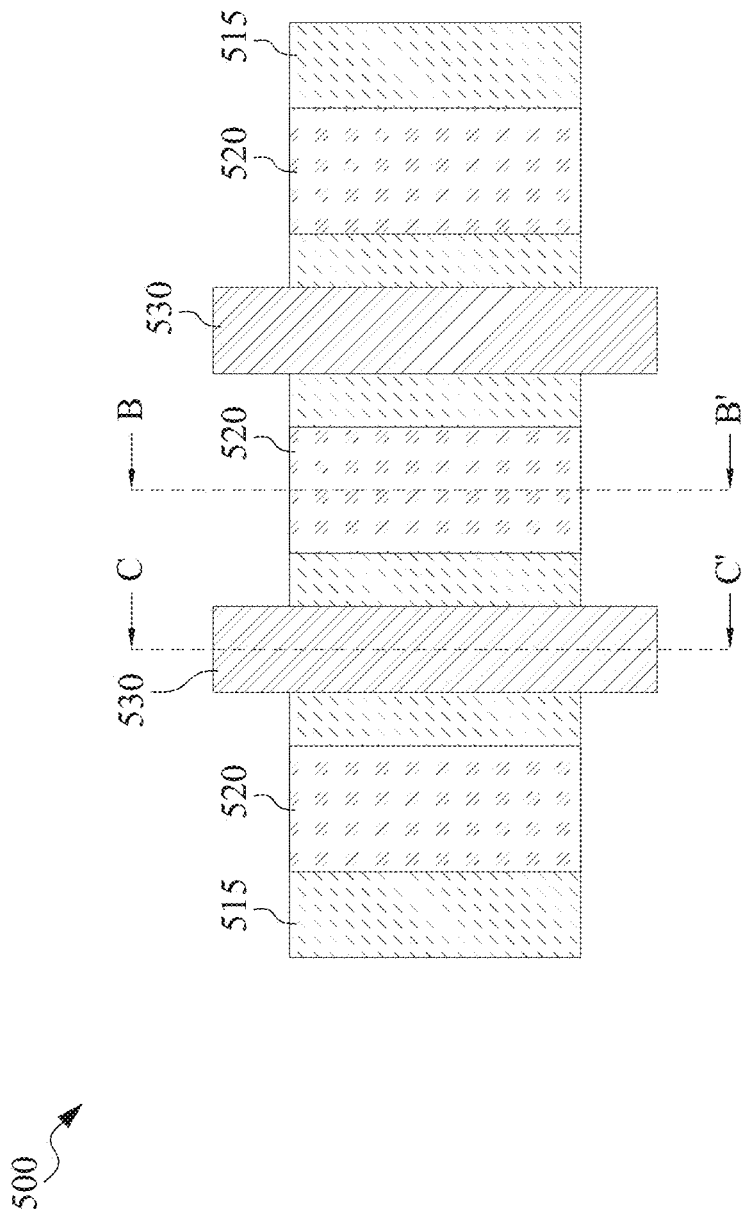
FIG. 5A is a top view of an amphi-FET structure, in accordance with some embodiments.

FIG. 5A is a top view of an amphi-FET 500 in accordance with some embodiments. The amphi-FET 500 includes a first active region 515. In some embodiments, the first active region 515 includes one or more NS. A plurality of first S/D electrodes 520 extend across the first active region 515. A plurality of first gate structures 530 also extend across the first active region 515 in an alternating fashion with the plurality of first S/D electrodes 520. The first S/D electrode 520 between the two first gate structures 530 is a shared first S/D electrode 520 for both of the first gate structures 530. FIG. 5A includes a view of the portions of the amphi-FET 500 only on a first side of a substrate. The substrate and portions of the amphi-FET 500 on the second side of the substrate are obscured by the structures in FIG. 5A. Conductive lines and vias are included in FIGS. 5B and 5C, but are not included in FIG. 5A for the sake of clarity.

Figure 5B:
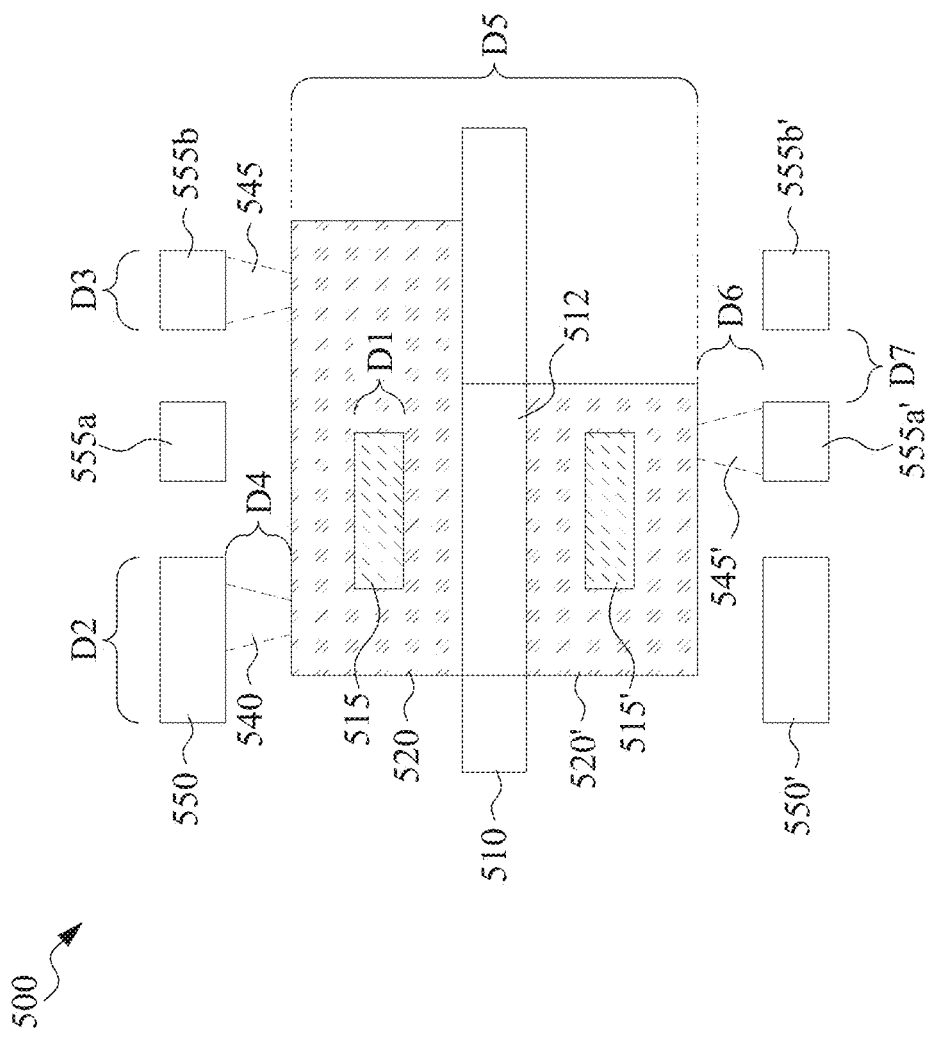
FIG. 5B is a cross-sectional view of the amphi-FET structure of FIG. 5 taken along the line B-B', in accordance with some embodiments.

FIG. 5B is a cross-sectional view of the amphi-FET 500 taken along the line B-B' in accordance with some embodiments. The amphi-FET 500 includes a substrate 510 and the first active area 515 is on a first side of the substrate 510. The first active area 515 includes one or more NS. The first S/D electrode 520 surrounds the portion of the first active region 515 seen in the cross-sectional view and extends between the first active region 515 and the substrate 510. A second active region 515' is on a second side of the substrate 510. The second active region 515' includes one or more NS. A second S/D electrode 520' surrounds the portion of the second active region 515' seen in the cross-sectional view and extends between the second active region 515' and the substrate 510. The first S/D electrode 520 is electrically connected to the second S/D electrode 520' by an S/D connect via 512 that extends through the substrate 510.

A first via 540 electrically connects the first S/D electrode 520 to a first power rail 550. In some embodiments, the first power rail 550 carries a reference voltage, e.g., ground. In some embodiments, the first power rail 550 carries a source voltage, e.g., VDD. In some embodiments, the first via 540 is omitted and the first power rail 550 is not directly connected to the first S/D electrode 520. A second via 545 electrically connects the first S/D electrode 520 to a second conductive line 555b. The second conductive line 555b is able to carry a signal to or from the first S/D electrode 520. In some embodiments, the second via 545 is omitted and the second conductive line 555b is not directly connected to the first S/D electrode 520. A first conductive line 555a is between the first power rail 550 and the second conductive line 555b. In some embodiments, the first conductive line 555a is connected to the first S/D electrode 520 by a via to carry a signal to or from the first S/D electrode 520. In some embodiments, the first S/D electrode 520 is electrically connected to the first power rail 550 and the second S/D electrode 520' is electrically connected to the second power rail 550'.

A third via 545' electrically connects the second S/D electrode 520' to a third conductive line 555a'. The third conductive line 555a' is able to carry a signal to or from the second S/D electrode 520'. In some embodiments, the third via 545' is omitted and the third conductive line 555a' is not directly connected to the second S/D electrode 520'. The third conductive line 555a' is between a second power rail 550' and a fourth conductive line 555b'. In some embodiments, the fourth conductive line 555b' is connected to the second S/D electrode 520' by a via to carry a signal to or from the second S/D electrode 520'.

In some embodiments, the second power rail 550' carries a reference voltage, e.g., ground. In some embodiments, the second power rail 550' carries a source voltage, e.g., VDD. In some embodiments, the second power rail 550' is connected to the second S/D electrode 520' by a via.

The material and formation method of the first via 540, the second via 545, the third via 545', the first power rail 550, the first conductive line 555a, the second conductive line 555b, the second power rail 550', the third conductive line 555a' and the fourth conductive line 555b' are similar to materials and formation methods for similar elements described above with respect to amphi-FET 200 (FIG. 2). The material and formation method of the S/D connect via 512 is similar to S/D connect via 212 (FIG. 2).

The first S/D electrode 520 and the second S/D electrode 520' conductive material surround S/D regions of the corresponding active regions. In some embodiments, the S/D regions include doped semiconductor materials. In some embodiments, the S/D regions include silicon. In some embodiments, the S/D regions include a strained material, such as silicon-germanium (SiGe). In some embodiments, the S/D regions are formed by epitaxial processes. In some embodiments, the S/D regions are formed by ion implantation. In some embodiments, the first S/D electrode 520 and the second S/D electrode 520' are formed by deposition. In some embodiments, the first S/D electrode 520 and the second S/D electrode 520' independently include cobalt (Co), tungsten (W), copper (Cu), ruthenium (Ru), titanium (Ti), tantalum (Ta), or alloys thereof, or other conductive materials. In some embodiments, a composition of the first S/D electrode 520 is a same composition as the second S/D electrode 520'. In some embodiments, the composition of the first S/D electrode 520 is different from the composition of the second S/D electrode 520'. In some embodiments, the first S/D electrode 520 and the second S/D electrode 520' include a silicide layer.

A width of the S/D connect via 512 in the substrate 510 is equal to a width of the second S/D electrode 520'. The width is measured in a direction parallel to a top surface of the substrate 510. Maximizing a size of the S/D connect via 512 helps to minimize resistance in the S/D connect via 512, which improves power consumption. The width of the second S/D electrode 520' is less than a width of the first S/D electrode 520. In some embodiments, the width of the second S/D electrode 520' is equal to the width of the first S/D electrode 520.

A first dimension D1 of the active region 515 in a first direction perpendicular to the top surface of the substrate 510 ranges from about 0.8 times to about 15 times a minimum gate width. If the first dimension D1 is too small, then resistance within a channel of the amphi-FET 500 increases and impacts device performance, in some instances. If the first dimension D1 is too large, then a size of the amphi-FET 500 is increased without significant improvement in device performance, in some instances. The minimum gate width is also referred to as a critical dimension (CD), in some instances. The minimum gate width is a smallest size that is reliably produced during a manufacturing process. One of ordinary skill in the art would recognize that different technology nodes have different manufacturing processes and are able to produce different minimum gate widths.

A ratio of the first dimension D1 and a second dimension D2 of the first power rail 550 in a second direction parallel to the top surface of the substrate 510 ranges from about 1 to about 5. If the second dimension D2 is too small, then resistance in the first power rail 550 increases to a level that negatively impacts power consumption and uniform power distribution within the device, in some instances. If the second dimension D2 is too large, then a size of the amphi-FET 500 is increased without a significant improvement in performance, in some instances. In some embodiments, the second power rail 550' has a same dimension as the first power rail 550.

A ratio of the first dimension D1 and a third dimension D3 of the second conductive line 555b in the second direction ranges from about 0.5 to about 3. If the third dimension D3 is too small, then resistance in the second conductive line 555b increases to a level that negatively impacts power consumption and signal reliability within the device, in some instances. If the third dimension D3 is too large, then a size of the amphi-FET 500 is increased without a significant improvement in performance, in some instances. In some embodiments, at least one of the first conductive line 555a, the third conductive line 555a' or the fourth conductive line 555b' has a same dimension as the second conductive line 555b.

A ratio of the first dimension D1 and a fourth dimension D4 of the first via 540 in the first direction ranges from about 2 to about 6. If the fourth dimension D4 is too small, then spacing between the first power rail 550 and the first S/D electrode 520 increases a risk of short circuiting within the device, in some instances. If the fourth dimension D4 is too large, then a size of the amphi-FET 500 is increased without a significant improvement in performance, in some instances. In some embodiments, at least one of the second via 545 or the third via 545' has a same dimension as the first via 540. In some embodiments, a sixth dimension D6 is equal to the fourth dimension D4. In some embodiments, the sixth dimension D6 is different from the fourth dimension D4.

A ratio of the first dimension D1 and a fifth dimension D5 from a surface of the first S/D electrode 520 farthest from the substrate 510 to a surface of the second S/D electrode 520' farthest from the substrate in the first direction ranges from about 10 to about 60. If the fifth dimension D5 is too small, then reliability of manufacturing the amphi-FET 500 is negatively impacted, in some instances. If the fifth dimension D5 is too large, then a size of the amphi-FET 500 is increased without a significant improvement in performance, in some instances.

A ratio of the first dimension D1 and a seventh dimension D7 of a space between the third conductive line 555a' and the fourth conductive line 555b' in the second direction ranges from about 0.5 to about 3. If the seventh dimension D7 is too small, then a risk of short circuit within the device or negative impacts from parasitic capacitance impact device performance, in some instances. If the seventh dimension D7 is too large, then a size of the amphi-FET 500 is increased without a significant improvement in performance, in some instances. In some embodiments, a spacing between other combinations of adjacent conductive lines and/or power rails has a same dimension as the seventh dimension D7.

Figure 5C:
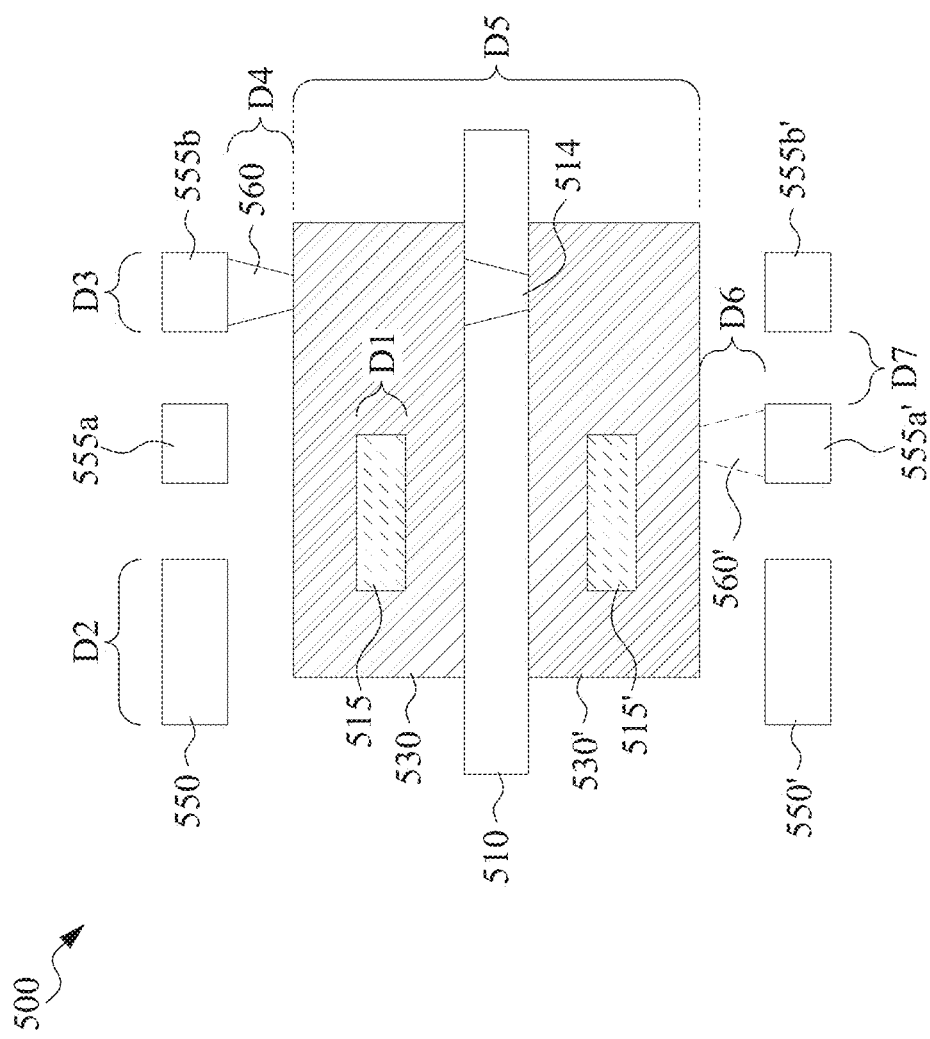
FIG. 5C is a cross-sectional view of the amphi-FET structure of FIG. 5 taken along the line C-C', in accordance with some embodiments.

FIG. 5C is a cross-sectional view of the amphi-FET 500 taken along line C-C' in accordance with some embodiments. Same elements from FIG. 5B have a same reference number and the description of these elements is omitted for the sake of brevity. A first gate structure 530 surrounds the portion of the first active region 515 visible in the cross-sectional view and extends between the first active region 515 and the substrate 510. A second gate structure 530' surrounds the portion of the second active region 515' visible in the cross-sectional view and extends between the second active region 515' and the substrate 510. The first gate structure 530 is electrically connected to the second gate structure 530' by gate via 514. In some embodiments, the gate via 514 is similar to the gate via 214 (FIG. 2). A first via 560 electrically connects the second conductive line 555b to the first gate structure 530 in order to carry a signal into or out of the first gate structure 530. In some embodiments, the first via 560 is omitted and the first gate structure 530 is not directly connected to the second conductive line 555b. A second via 560' electrically connects the third conductive line 555a' to the second gate structure 530' to carry a signal into or out of the second gate structure 530'. In some embodiments, the second via 560' is omitted and the second gate structure 530' is not directly connected to the third conductive line 555a'. While FIG. 5C includes a connection to both the first gate structure 530 and the second gate structure 530', one of ordinary skill in the art would recognize that in most situations the gate structures 530 and 530' will be driven from a single side. That is, in most situations only one of the first via 560 or the second via 560' will be present. In some embodiments where the amphi-FET 500 is in a constant ON or OFF state, the first gate structure 530 is connected to the first power rail 550 by a via. In some embodiments where the amphi-FET 500 is in a constant ON or OFF state, the second gate structure 530' is connected to the second power rail 550' by a via.

In some embodiments, a size of the gate via 514 is a same size as the first via 560. Having the gate via 514 have a same size as the first via 560 reduces production cost by minimizing a number of masks used to produce the amphi-FET 500. Having the gate via 514 have the same size as the first via 560 also helps to reduce manufacturing error because the openings for forming the first via 560 and the gate via 514 are self-aligned.

The first gate structure 530 and the second gate structure 530' independently include a gate dielectric layer and a gate electrode. The gate dielectric layer is between the corresponding active region and the corresponding gate electrode. In some embodiments, the gate dielectric layer includes silicon oxide and is formed by oxidizing an outer surface of the corresponding active region. In some embodiments, the gate dielectric layer includes silicon nitride or a high-k dielectric material. In some embodiments, the gate dielectric layer is formed by deposition, such as CVD, PVD, ALD or another suitable deposition process. The gate electrode includes a conductive material. In some embodiments, the gate electrode includes polysilicon. In some embodiments, the gate electrode comprises a metal, such as copper (Cu), cobalt (Co), aluminum (Al), tungsten (W), alloys or another suitable metal. In some embodiments, the gate electrode is formed by deposition, such as CVD, PVD, ALD or another suitable deposition process. In some embodiments, the first gate structure 530 and the second gate structure 530' independently include an interfacial layer between the gate dielectric layer and the corresponding active region. In some embodiments, the first gate structure 530 and the second gate structure 530' independently include a silicide layer.

Figure 6A:
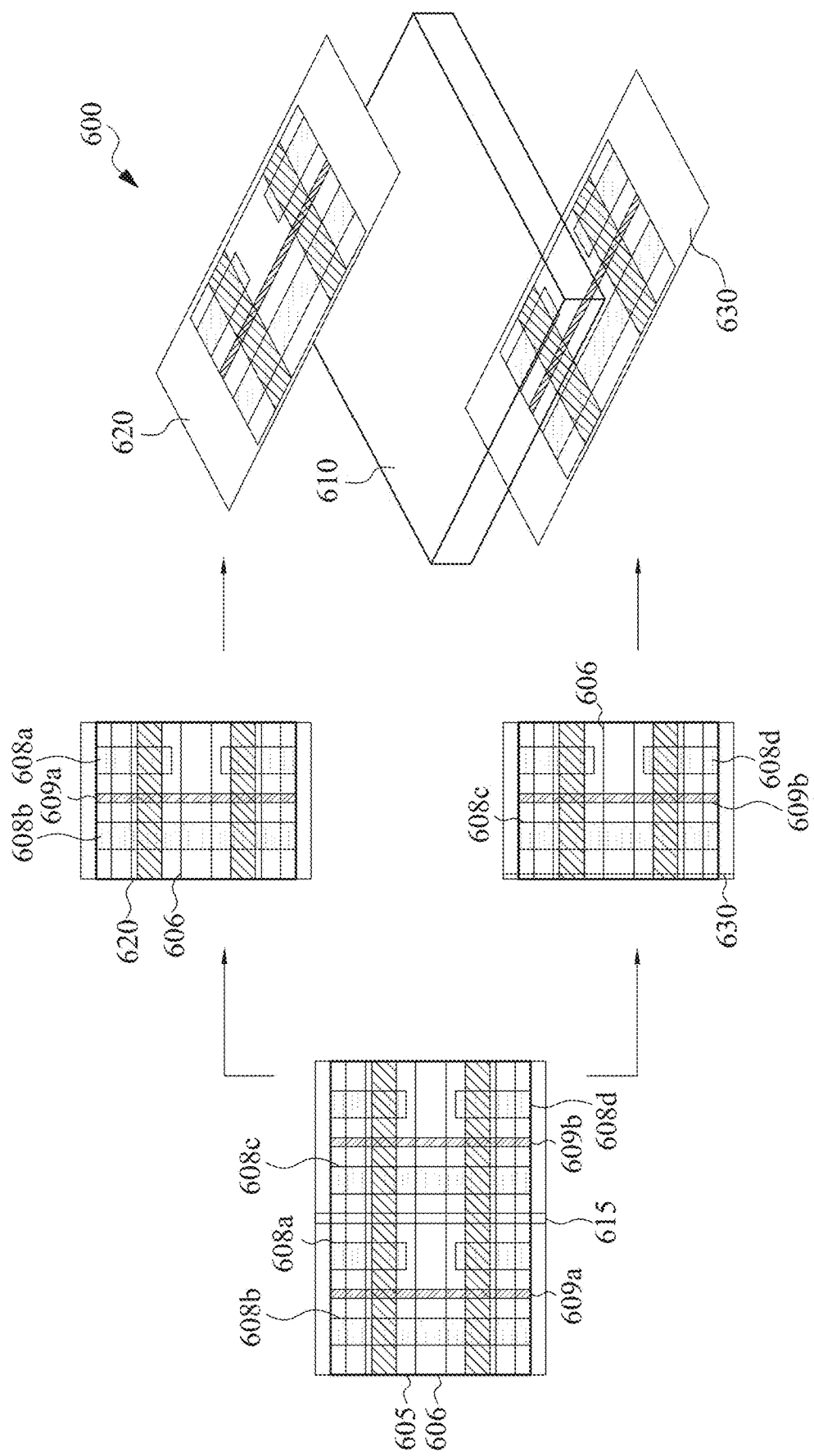
FIG. 6A is a schematic flowchart of a method of converting a layout of a FET structure into a layout of an amphi-FET structure, in accordance with some embodiments.
Figure 15:
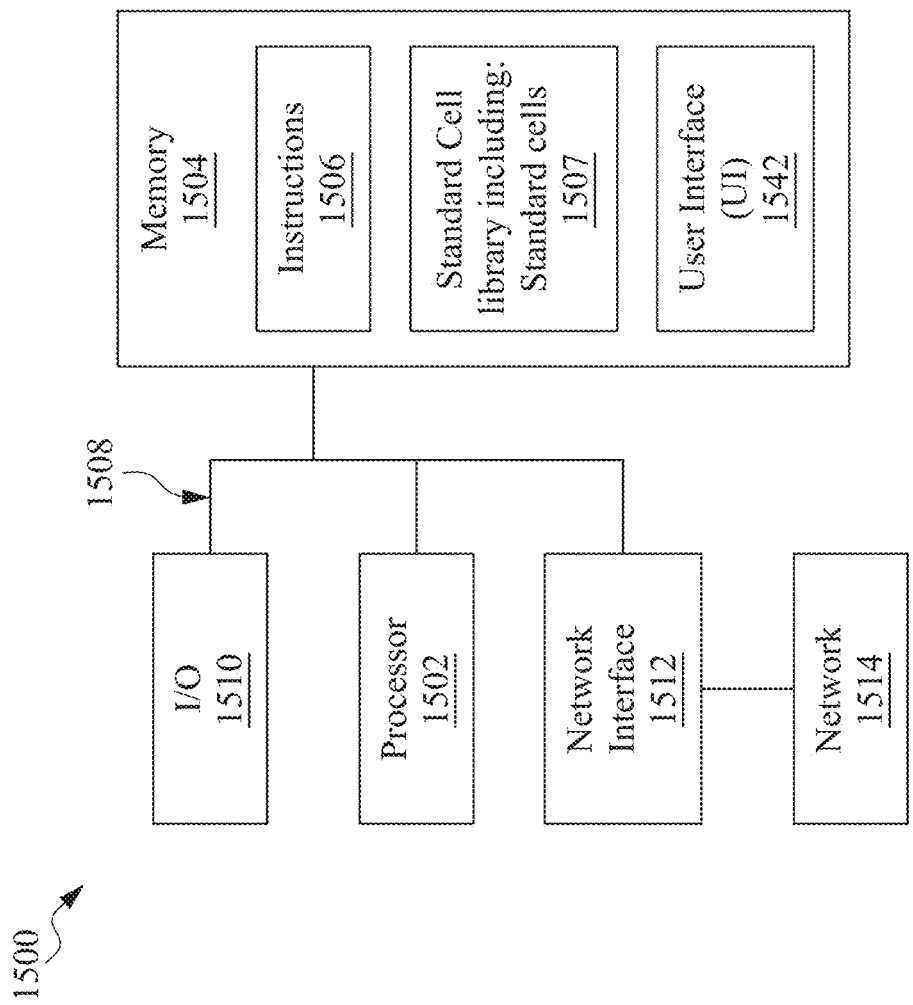
FIG. 15 is a block diagram of an electronic design automation (EDA) system, in accordance with some embodiments.

FIG. 6A is a schematic flowchart of a method 600 of converting a layout of a FET structure into a layout of an amphi-FET structure in accordance with some embodiments. In some embodiments, the method 600 is executed by electronic design automation (EDA) system, such as EDA system 1500 (FIG. 15).

A FET layout 605 is received. The FET layout 605 is a layout for a structure designed to be formed on a single side of a substrate. In some embodiments, the FET layout 605 is for a GAA device, a FinFET device or a MOSFET device. In some embodiments, the FET layout 605 is received from a cell library. In some embodiments, the FET layout 605 is received from a user input. The FET layout 605 includes a plurality of routing tracks 606. In some embodiments, at least one of the routing tracks 606 is a power rail. The FET layout 605 further includes a plurality of S/D electrodes including a first S/D electrode 608a, a second S/D electrode 608b, a third S/D electrode 608c and a fourth S/D electrode 608d. The FET layout 605 includes a first gate structure 609a and a second gate structure 609b.

A vertical cut line 615 is added to the FET layout 605. The vertical cut line 615 extends through the FET layout 605 in a direction perpendicular to the plurality of routing tracks 606. The vertical cut line 615 is between the first S/D electrode 608a and the third S/D electrode 608c.

The FET layout 605 is then divided into two cells. A first cell 620 includes the first S/D electrode 608a, the second S/D electrode 608b and the first gate structure 609a. The location of routing tracks 606 in the first cell 620 is the same as the location of the routing tracks 606 in the FET layout 605. A second cell 630 includes the third S/D electrode 608c, the fourth S/D electrode 608d and the second gate structure 609b. The location of routing tracks 606 in the second cell 630 is the same as the location of the routing tracks 606 in the FET layout 605. Maintaining the same location of the routing tracks 606 in the first cell 620 and the second cell 630 helps to simplify routing operations, such as automatic placement and routing (APR).

The first cell 620 is then processed to be formed on a first side of a substrate 610 and the second cell 630 is processed to be formed on a second side of the substrate 610 opposite to the first side. In some embodiments, the substrate 610 is similar to the substrate 210 (FIG. 2). Using the method 600, an overall size of the amphi-FET device manufactured is reduced in comparison with manufacturing the FET layout 605 on a single side of the substrate.

Figure 6B:
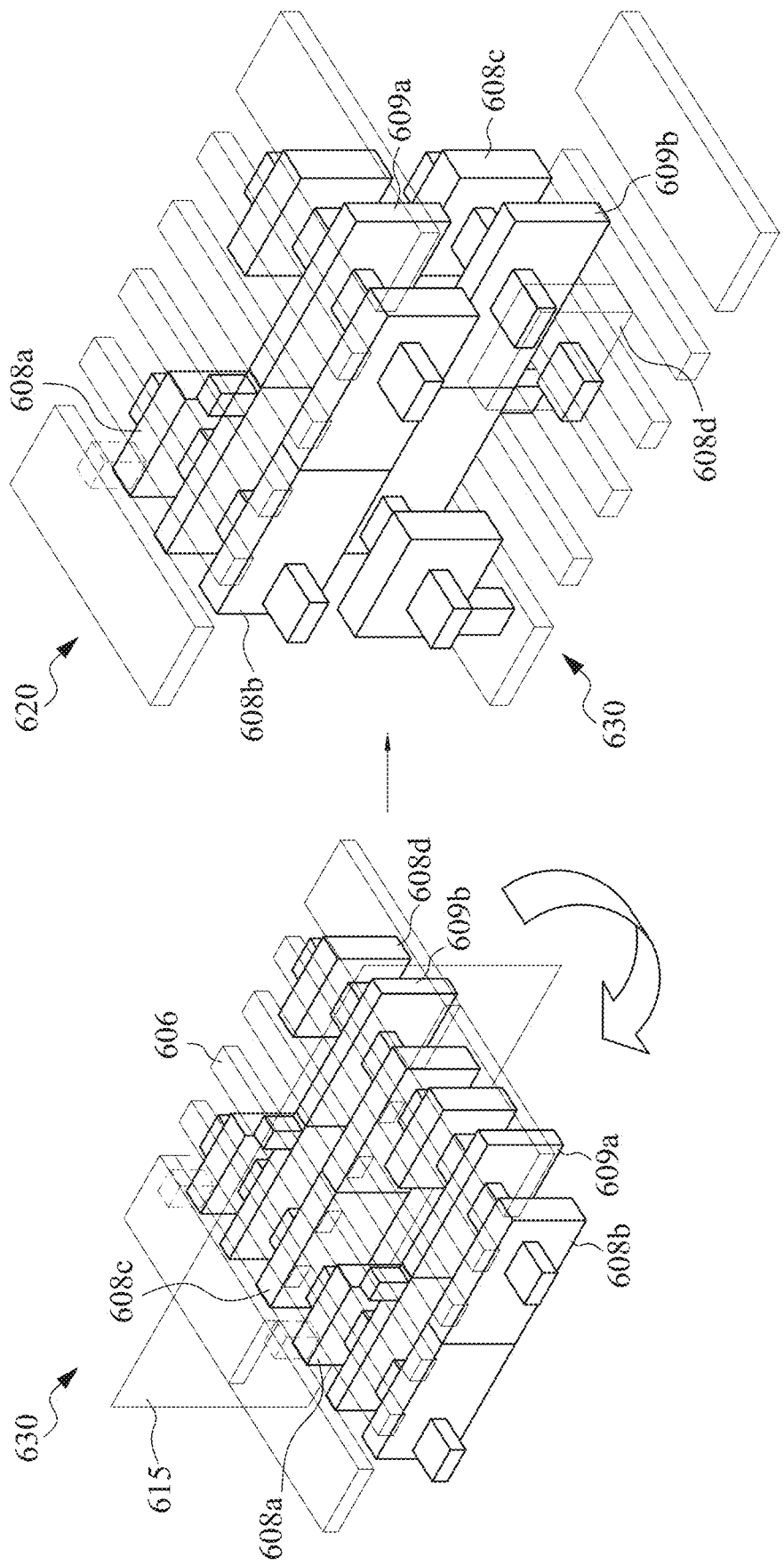
FIG. 6B is perspective views of a FET structure converted into an amphi-FET structure, in accordance with some embodiments.

FIG. 6B is perspective views of a FET structure converted into an amphi-FET structure in accordance with some embodiments. The substrate 610 is not included in FIG. 6B for the sake of clarity of the drawing. The left side of FIG. 6B is an example of the FET layout 605 for manufacturing on a single side of a substrate. The vertical cut line 615 is not part of the structure, but is included in FIG. 6B to indicate a location where the device is cut based on the method 600 (FIG. 6A). The right side of FIG. 6B is an example of an amphi-FET structure formed by the method 600. As seen in FIG. 6B, elements in front of the vertical cut line 615 form the first cell 620 on a first side of a substrate. Elements behind the vertical cut line 615 form the second cell 630 on a second side of the substrate. A gate via, such as gate via 514 (FIG. 5C), would electrically connect the first gate structure 609a to the second gate structure 609b through the substrate. In some embodiments, an S/D connect via, such as S/D connect via 512 (FIG. 5B), electrically connects the first S/D electrode 608a to the third electrode 608c through the substrate. In some embodiments, the S/D connect via electrically connects the second S/D electrode 608b to the fourth S/D electrode 608d through the substrate. Since the vertical cut line 615 does not extend through any S/D electrodes of the FET layout 605, in some embodiments, the amphi-FET does not include an S/D connect via.

Figure 7A:
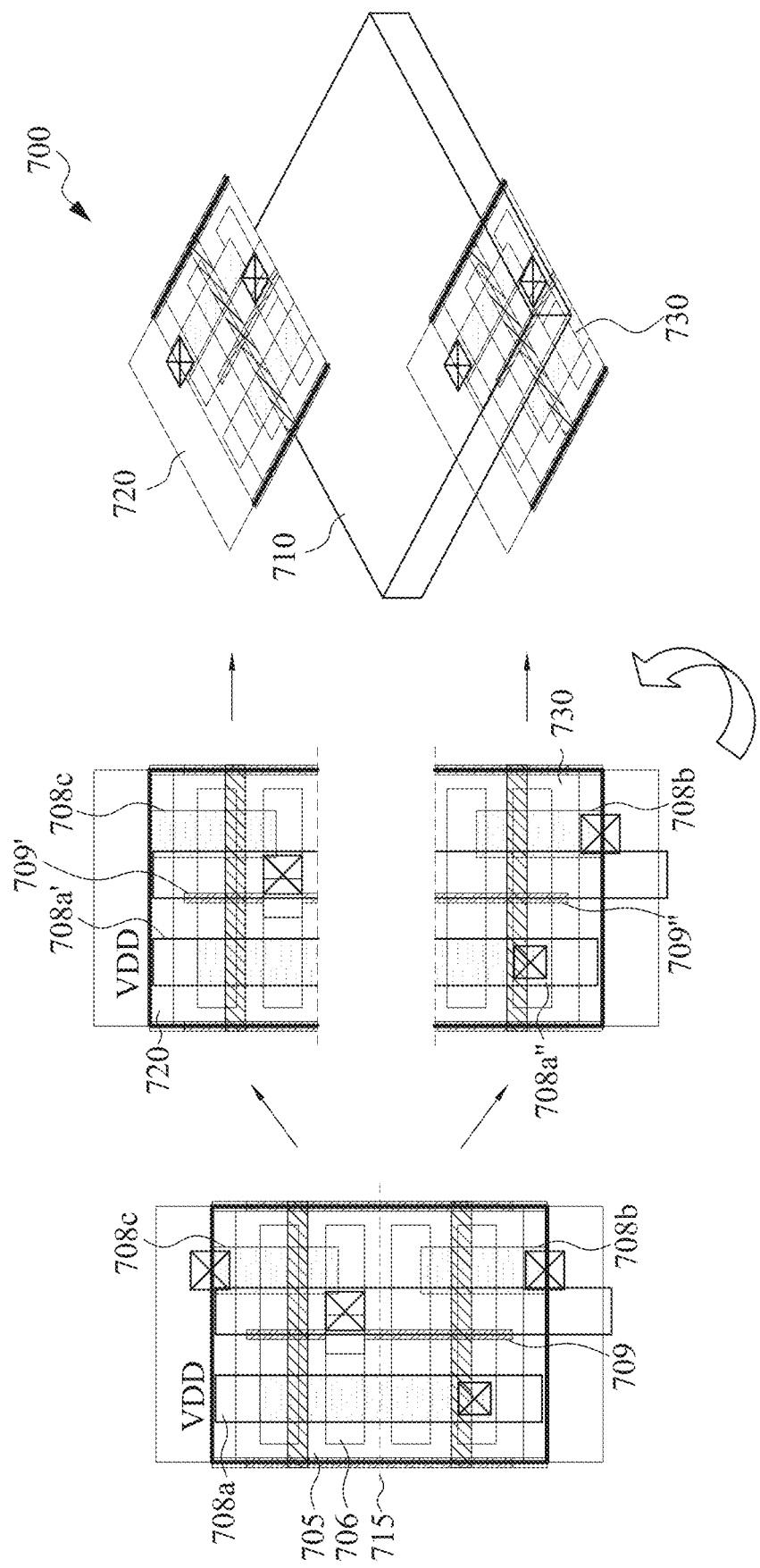
FIG. 7A is a schematic flowchart of a method of converting a layout of a FET structure into a layout of an amphi-FET structure, in accordance with some embodiments.

FIG. 7A is a schematic flowchart of a method 700 of converting a layout of a FET structure into a layout of an amphi-FET structure, in accordance with some embodiments. In some embodiments, the method 700 is executed by an electronic design automation (EDA) system, such as EDA system 1500 (FIG. 15).

A FET layout 705 is received. The FET layout 705 is a layout for a structure designed to be formed on a single side of a substrate. In some embodiments, the FET layout 705 is for a GAA device, a FinFET device or a MOSFET device. In some embodiments, the FET layout 705 is received from a cell library. In some embodiments, the FET layout 705 is received from a user input. The FET layout 705 includes a plurality of routing tracks 706. In some embodiments, at least one of the routing tracks 706 is a power rail. The FET layout 705 further includes a plurality of S/D electrodes includes a first S/D electrode 708a, a second S/D electrode 708b and a third S/D electrode 708c. The FET layout 705 includes a gate structure 709.

A horizontal cut line 715 is added to the FET layout 705. The horizontal cut line 715 extends through the FET layout 705 in a direction parallel to the plurality of routing tracks 706. The horizontal cut line 715 is between the second S/D electrode 708b and the third S/D electrode 708c. The horizontal cut line 715 passes through the gate structure 709.

The FET layout 705 is then divided into two cells. A first cell 720 includes a first portion 708a' of the first S/D electrode 708a, the third S/D electrode 708c and a first portion 709' of the gate structure 709. The location of routing tracks 706 in the first cell 720 are the same as the location of the routing tracks 706 in the FET layout 705. A second cell 730 includes a second portion 708a" of the first S/D electrode 708*a*, the second S/D electrode 708*b* and a second portion 709" of the gate structure 709. The location of routing tracks 706 in the second cell 730 are the same as the location of the routing tracks 706 in the FET layout 705. Maintaining the same location of the routing tracks 706 in the first cell 720 and the second cell 730 helps to simplify routing operations, such as automatic placement and routing (APR).

The first cell 720 is then processed to be formed on a first side of a substrate 710 and the second cell 730 is processed to be formed on a second side of the substrate 710 opposite to the first side. In some embodiments, the substrate 710 is similar to the substrate 210 (FIG. 2). Using the method 700, an overall size of the amphi-FET device manufactured is reduced in comparison with manufacturing the FET layout 705 on a single side of the substrate.

FIG. 7B is perspective views of a FET structure converted into an amphi-FET structure in accordance with some embodiments. The substrate 710 is not included in FIG. 7B for the sake of clarity of the drawing. The left side of FIG. 7B is an example of the FET layout 705 for manufacturing on a single side of a substrate. The horizontal cut line 715 is not part of the structure, but is included in FIG. 7B to indicate a location where the device is cut based on the method 700 (FIG. 7A). The right side of FIG. 7B is an example of an amphi-FET structure formed by the method 700. As seen in FIG. 7B, elements to the left of the horizontal cut line 715 form the first cell 720 on a first side of a substrate. Elements to the right of the horizontal cut line 715 form the second cell 730 on a second side of the substrate. A gate via 714, similar to gate via 514 (FIG. 5C), electrically connects the first portion 709' of the gate structure 709 to the second portion 709" of the gate structure 709 through the substrate. An S/D connect via 712, similar to the S/D connect via 512 (FIG. 5B), electrically connects the first portion 708*a*' of the first S/D electrode 708*a* to the second portion 708*a*" of the first S/D electrode 708*a* through the substrate.

Figure 7E:
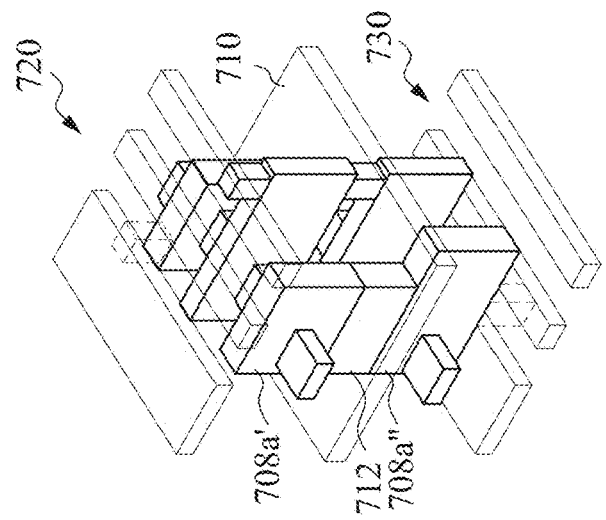
FIGS. 7C-7E are perspective views of portions of the amphi-FET structure in FIG. 7B, in accordance with some embodiments.
Figure 7D:
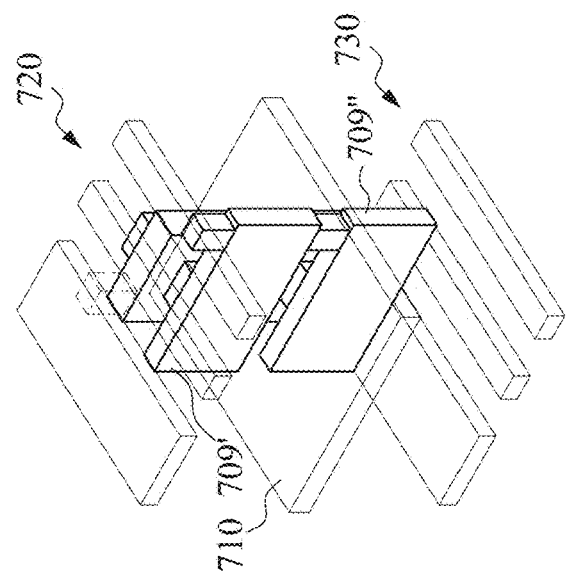
Figure 7C:
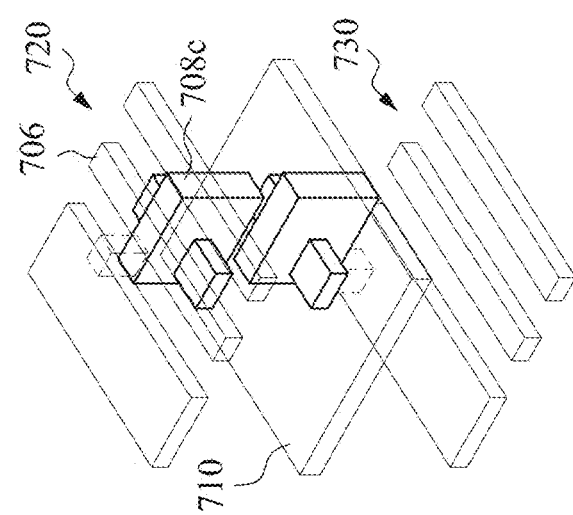

FIG. 7C is a perspective view of a portion of the amphi-FET structure of FIG. 7B in accordance with some embodiments. Other portions of the amphi-FET structure are omitted for the sake of clarity. FIG. 7C includes the substrate 710. No S/D connect via extends through the substrate 710 to electrically connect to the third S/D electrode 708*c*.

FIG. 7D is a perspective view of a portion of the amphi-FET structure of FIG. 7B. In comparison with FIG. 7C, the first portion 709' of the gate structure 709 and the second portion 709" of the gate structure 709 are included. The gate via 714 extends through the substrate 710 to electrically connect the first portion 709' of the gate structure 709 to the second portion 709" of the gate structure.

FIG. 7E is a perspective view of the amphi-FET structure of FIG. 7B including the substrate 710. In comparison with FIG. 7D, the first portion 708*a*' of the first S/D electrode 708*a* and the second portion 708" of the first S/D electrode 708*a* are included. The S/D connect via 712 extends through the substrate 710 to electrically connect the first portion 708*a*' of the first S/D electrode 708*a* and the second portion 708" of the first S/D electrode 708*a*.

Figure 8:
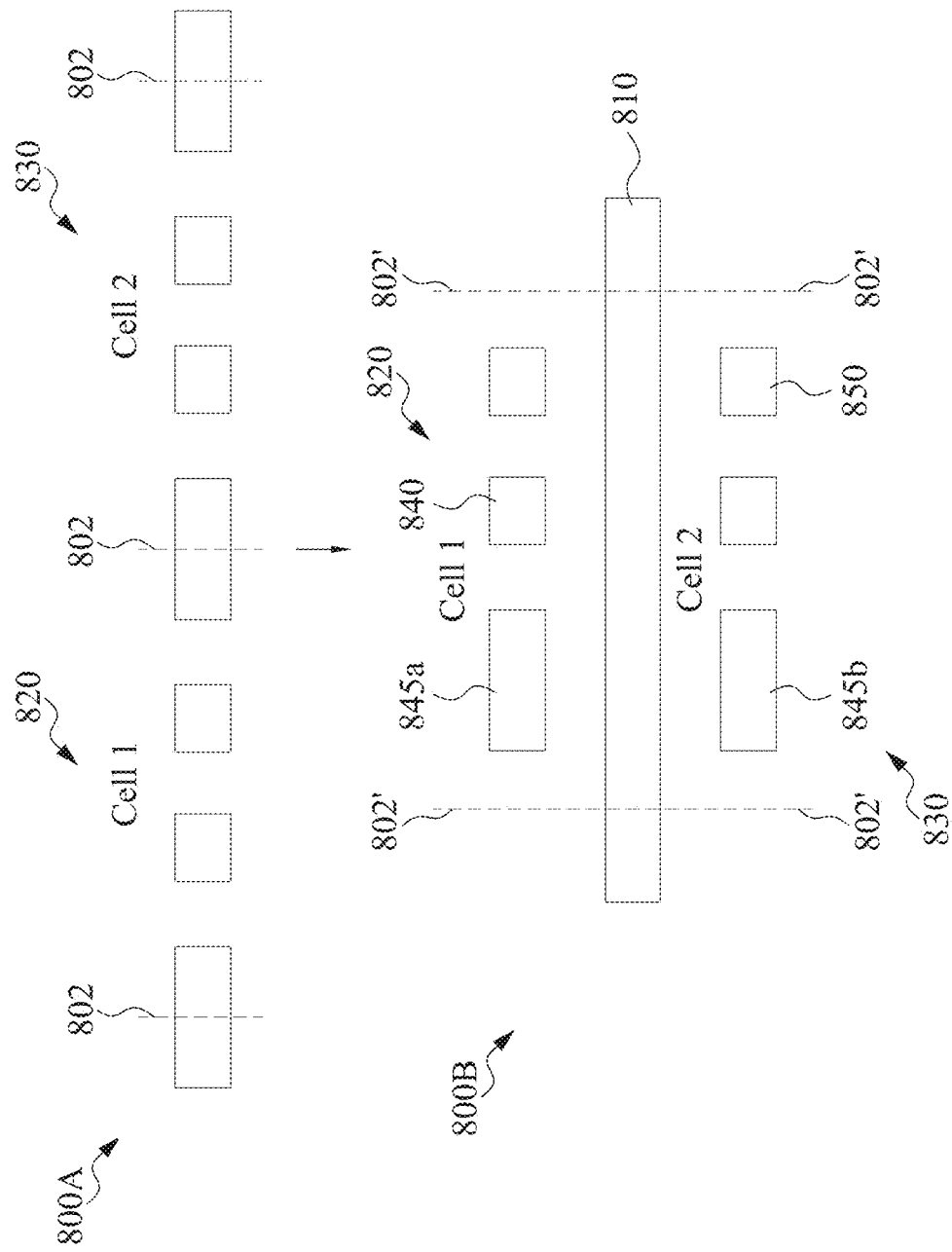
FIG. 8 is view of converting neighboring cells in a layout of a FET structure to a layout of an amphi-FET structure, in accordance with some embodiments.

FIG. 8 is view of converting neighboring cells in a layout of a FET structure 800A to a layout of an amphi-FET structure 800B, in accordance with some embodiments. The layout of the FET structure 800A includes two cells having cell boundaries 802. For clarity, only routing lines are included in the layout of the FET structure 800A. One of ordinary skill in the art would understand that additional components, such as those described above, are part of the FET structure 800A and the amphi-FET structure 800B. A first conductive line 840 is in the first cell 820 and a second conductive line 850 is in the second cell 830. A power rail 845 extends across a cell boundary 802 between the first cell 820 and the second cell 830. The power rail 845 is called a shared power rail, in some instances.

The layout of the amphi-FET structure 800B includes the first cell 820 on a first side of a substrate 810 and the second cell 830 on the second side of the substrate 810 with cell boundaries 802' for both cells aligned. When the layout of the FET structure 800A is converted to a layout of an amphi-FET structure 800B, the shared power rail is duplicated so that a first power rail 845*a* is in the first cell 820 and a second power rail 845*b* is in the second cell 830. The shared power rail is duplicated instead of being cut in half in order to avoid the increase in resistance that would result from reducing the size of the power rail. While the duplication of the shared power rail means a magnitude of the size reduction for the amphi-FET structure 800B is not as significant as if the shared power rail is cut in half, the amphi-FET structure 800B is still smaller than the FET structure 800A. In addition, the power consumption of the amphi-FET structure 800B will be similar to the power consumption of the FET structure 800A due to the similar sizes of the power rails in both structures.

FIG. 9 is a view of a layout of an amphi-FET structure 900 in accordance with some embodiments. For clarity, only routing lines are included in the layout of the amphi-FET structure 900. One of ordinary skill in the art would understand that additional components, such as those described above, are part of the amphi-FET structure 900. The layout of the amphi-FET structure 900 includes a first cell 920 on a first side of a substrate 910 and a second cell 930 on the second side of the substrate 910 with cell boundaries 902 for both cells aligned. The layout of the amphi-FET structure 900 includes a first shared power rail 950*a* in the first cell 920 and a second shared power rail 950*b* in the second cell 930. The first shared power rail 950*a* and the second shared power rail 950*b* both overlap a cell boundary 902 and are accessible by an adjacent cell on the same side of the substrate as each of the corresponding share power rails.

The first cell 920 further includes a first conductive line 930*a* completely within the cell boundaries 902 and a first shielding line 940*a* on the cell boundary 902. The second cell 930 further includes a second conductive line 930*b* completely within the cell boundaries 902 and a second shielding line 940*b* on the cell boundary 902. A shielding line is usable to reduce coupling noise between adjacent conductive lines in an interconnect structure. In a structure formed entirely on a same side of the substrate, the shielding line is not usable because using the shielding line to carry a signal would negate the shielding effect. However, when used in an amphi-FET structure, one of the first shielding line 940*a* or the second shielding line 940*b* is usable to carry a signal. Thus, by using the amphi-FET structure, an additional line within the interconnect structure becomes usable for routing. The additional routing options helps to reduce or avoid increases in size of the amphi-FET in order to accommodate routing of signals to the amphi-FET. In some instances, the layout of the amphi-FET 900 is called a 2.5T horizontal cut mirror because there are five usable tracks (power rails are excluded from usable track determinations) between two cells. That is, each of the first cell 920 and the second cell 930 is considered to have 2.5 usable tracks.

FIG. 10 is a view of a layout of an amphi-FET structure 1000 in accordance with some embodiments. For clarity, only routing lines are included in the layout of the amphi- FET structure 1000. One of ordinary skill in the art would understand that additional components, such as those described above, are part of the amphi-FET structure 1000. The layout of the amphi-FET structure 1000 includes a first cell 1020 on a first side of a substrate 1010 and a second cell 1030 on the second side of the substrate 1010 with cell boundaries 1002 for both cells aligned. The layout of the amphi-FET structure 1000 includes a first power rail 1050*a* completely within the cell boundaries 1002 in the first cell 1020. A second power rail 1050*b* is completely within the cell boundaries 1002 in the second cell 1030. The first cell 1020 further includes a first conductive line 1030*a* for carrying signals into and out of the first cell 1020 and the second cell 1030 includes a second conductive line 1030*b* for carrying signals into and out of the second cell 1030. The other unlabeled conductive lines are similar to the first conductive line 1030*a* and the second conductive line 1030*b*. The first cell 1020 and the second cell 1030 are free of shielding lines along the cell boundaries 1002. Thus, each of the first cell 1020 and the second cell 1030 includes four usable tracks. In some instances, the layout of the amphi-FET 1000 is called a 4T vertical cut stack.

Figure 11:
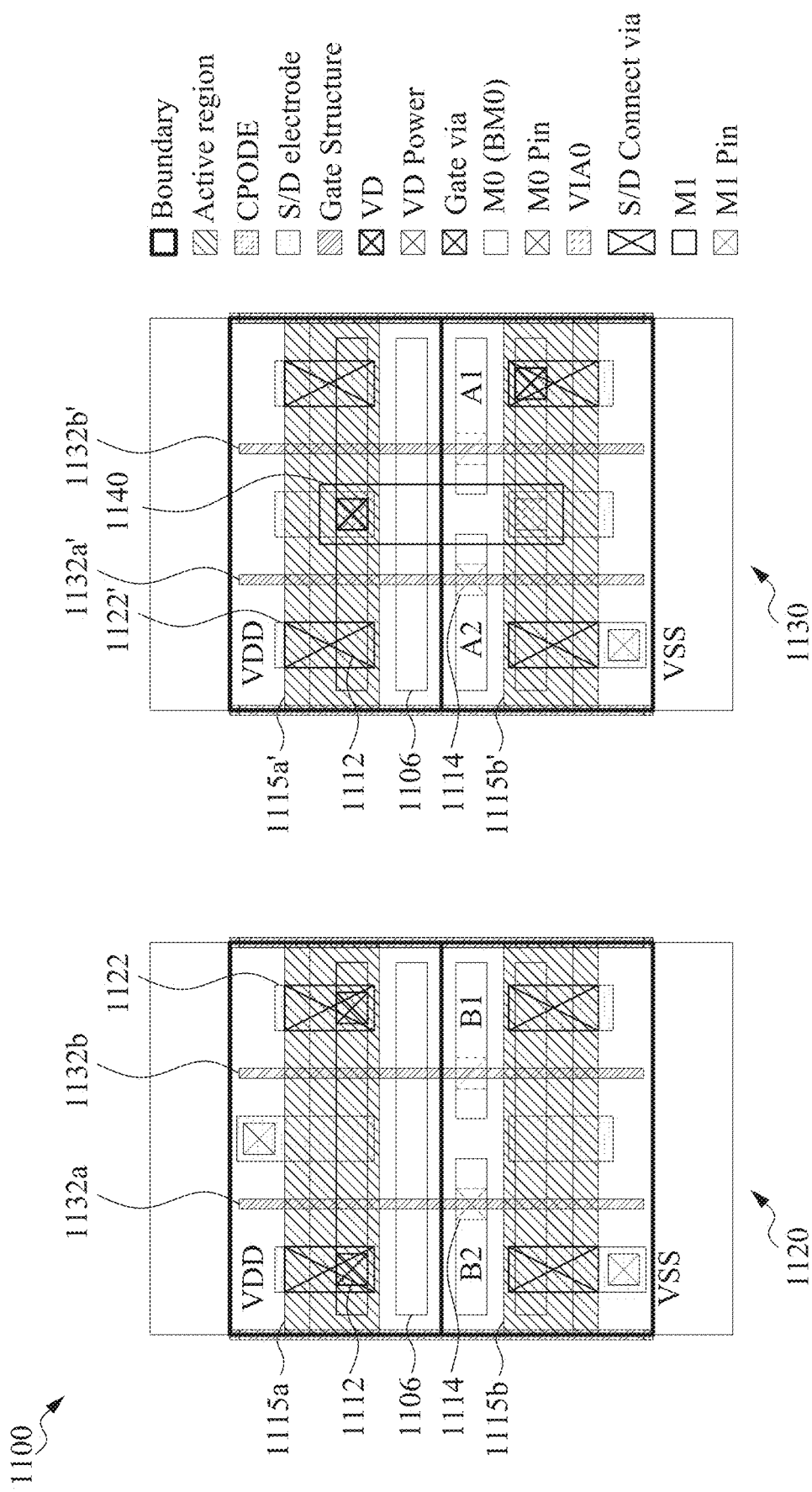
FIG. 11 is a view of a layout of an amphi-FET structure, in accordance with some embodiments.

FIG. 11 is a view of a layout of an amphi-FET structure 1100 in accordance with some embodiments. Less than all of the elements in the layout of the amphi-FET 1100 are labeled for the sake of clarity of the drawing. A legend is provided to assist with understanding of the different symbols in the layout of the amphi-FET 1100. The layout of the amphi-FET structure 1100 includes a layout of a first cell 1120 to be formed on a first side of a substrate and a layout of a second cell 1130 to be formed on a second side of the substrate opposite the first side.

The first cell 1120 includes a plurality of routing tracks 1106. The routing tracks 1106 are locations where conductive lines are able to be formed one level farther away from the substrate than the elements in the layout of the amphi-FET structure 1100. The first cell 1120 further includes a first active region 1115*a* and a second active region 1115*b* spaced from the first active region 1115*a*. In some embodiments, the first active region 1115*a* and the second active region 1115*b* include one or more NS. The first cell 1120 further includes a first S/D electrode 1122 associated with the first active region 1115*a*. The first cell 1120 further includes a first gate structure 1132*a* and a second gate structure 1132*b*, each of which are associated with both the first active region 1115*a* and the second active region 1115*b*.

The second cell 1130 includes the plurality of routing tracks 1106. The routing tracks 1106 are locations where conductive lines are able to be formed one level farther away from the substrate than the elements in the layout of the amphi-FET structure 1100. The second cell 1130 further includes a third active region 1115*a'* and a fourth active region 1115*b'* spaced from the third active region 1115*a'*. In some embodiments, the third active region 1115*a'* and the fourth active region 1115*b'* include one or more NS. The second cell 1130 further includes a second S/D electrode 1122' associated with the third active region 1115*a'*. The second cell 1130 further includes a third gate structure 1132*a'* and a fourth gate structure 1132*b'*, each of which are associated with both the third active region 1115*a'* and the fourth active region 1115*b'*. The second cell 1130 further includes a connector 1140 electrically connecting an S/D electrode associated with the third active region 1115*a'* to an S/D electrode associated with the fourth active region 1115*b'*.

An S/D connect via 1112 electrically connects the first S/D electrode 1122 to the second S/D electrode 1122' through the substrate. A gate via 1114 electrically connects the first gate structure 1132*a* to the third gate structure 1132*a'* through the substrate. One of ordinary skill in the art would understand that the components of the layout of the amphi-FET 1100 are formed using materials and processes described above, which are not repeated here for the sake of brevity.

Figure 12:
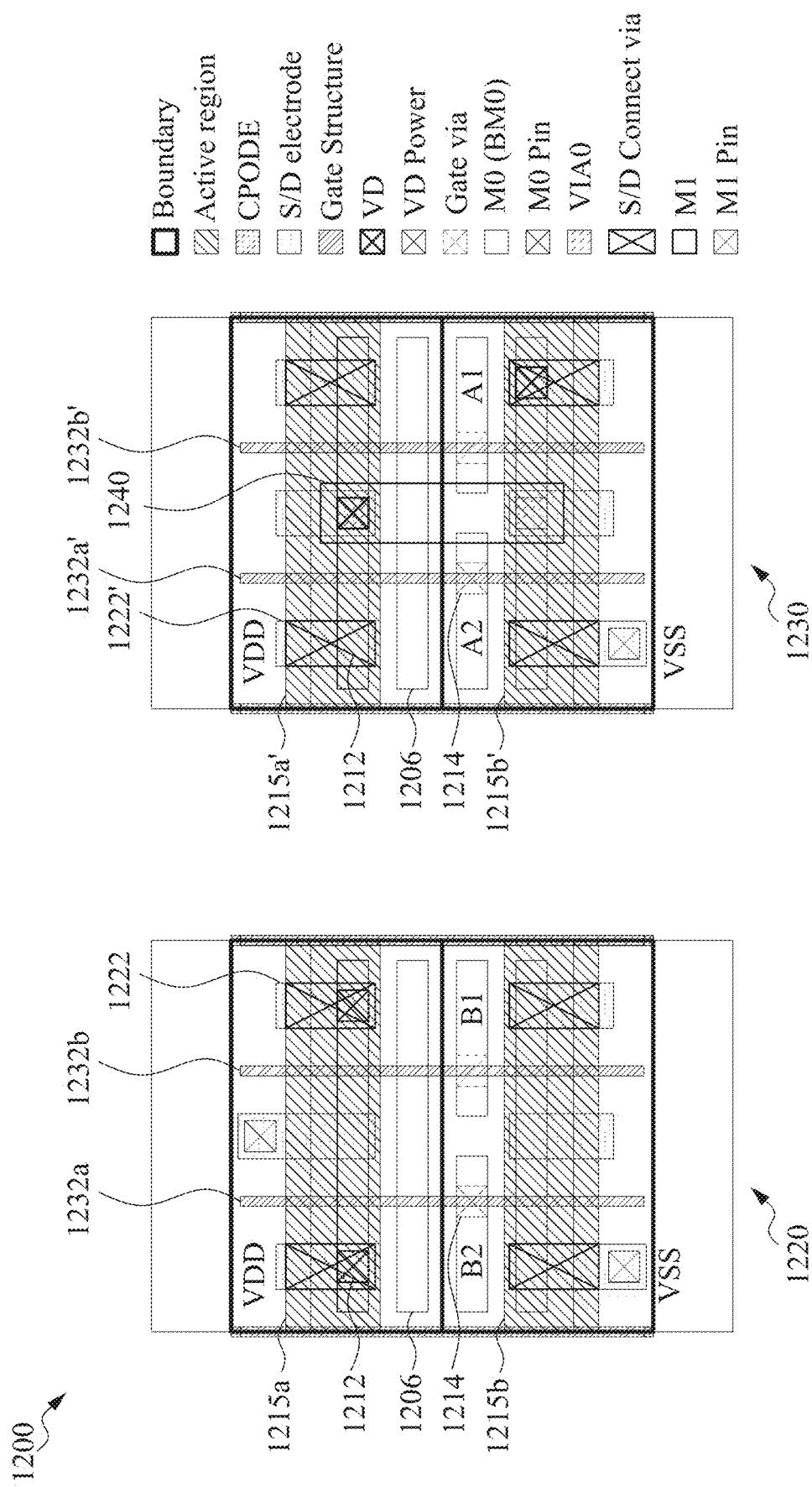
FIG. 12 is a view of a layout of an amphi-FET structure, in accordance with some embodiments.

FIG. 12 is a view of a layout of an amphi-FET structure 1200 in accordance with some embodiments. Less than all of the elements in the layout of the amphi-FET 1200 are labeled for the sake of clarity of the drawing. A legend is provided to assist with understanding of the different symbols in the layout of the amphi-FET 1200. In comparison with the layout of amphi-FET 1100 (FIG. 11), a size of the active regions in the layout of the amphi-FET 1200 are smaller. The smaller active regions reduces a size of the layout of the amphi-FET 1200, but also reduces switching speed. The layout of the amphi-FET structure 1200 includes a layout of a first cell 1220 to be formed on a first side of a substrate; and a layout of a second cell 1230 to be formed on a second side of the substrate opposite the first side.

The first cell 1220 includes a plurality of routing tracks 1206. The routing tracks 1206 are locations where conductive lines are able to be formed one level farther away from the substrate than the elements in the layout of the amphi-FET structure 1200. The first cell 1220 further includes a first active region 1215*a* and a second active region 1215*b* spaced from the first active region 1215*a*. In some embodiments, the first active region 1215*a* and the second active region 1215*b* include one or more NS. The first cell 1220 further includes a first S/D electrode 1222 associated with the first active region 1215*a*. The first cell 1220 further includes a first gate structure 1232*a* and a second gate structure 1232*b*, each of which are associated with both the first active region 1215*a* and the second active region 1215*b*.

The second cell 1230 includes the plurality of routing tracks 1206. The routing tracks 1206 are locations where conductive lines are able to be formed one level farther away from the substrate than the elements in the layout of the amphi-FET structure 1200. The second cell 1230 further includes a third active region 1215*a'* and a fourth active region 1215*b'* spaced from the third active region 1215*a'*. In some embodiments, the third active region 1215*a'* and the fourth active region 1215*b'* include one or more NS. The second cell 1230 further includes a second S/D electrode 1222' associated with the third active region 1215*a'*. The second cell 1230 further includes a third gate structure 1232*a'* and a fourth gate structure 1232*b'*, each of which are associated with both the third active region 1215*a'* and the fourth active region 1215*b'*. The second cell 1230 further includes a connector 1240 electrically connecting an S/D electrode associated with the third active region 1215*a'* to an S/D electrode associated with the fourth active region 1215*b'*.

Figure 13:
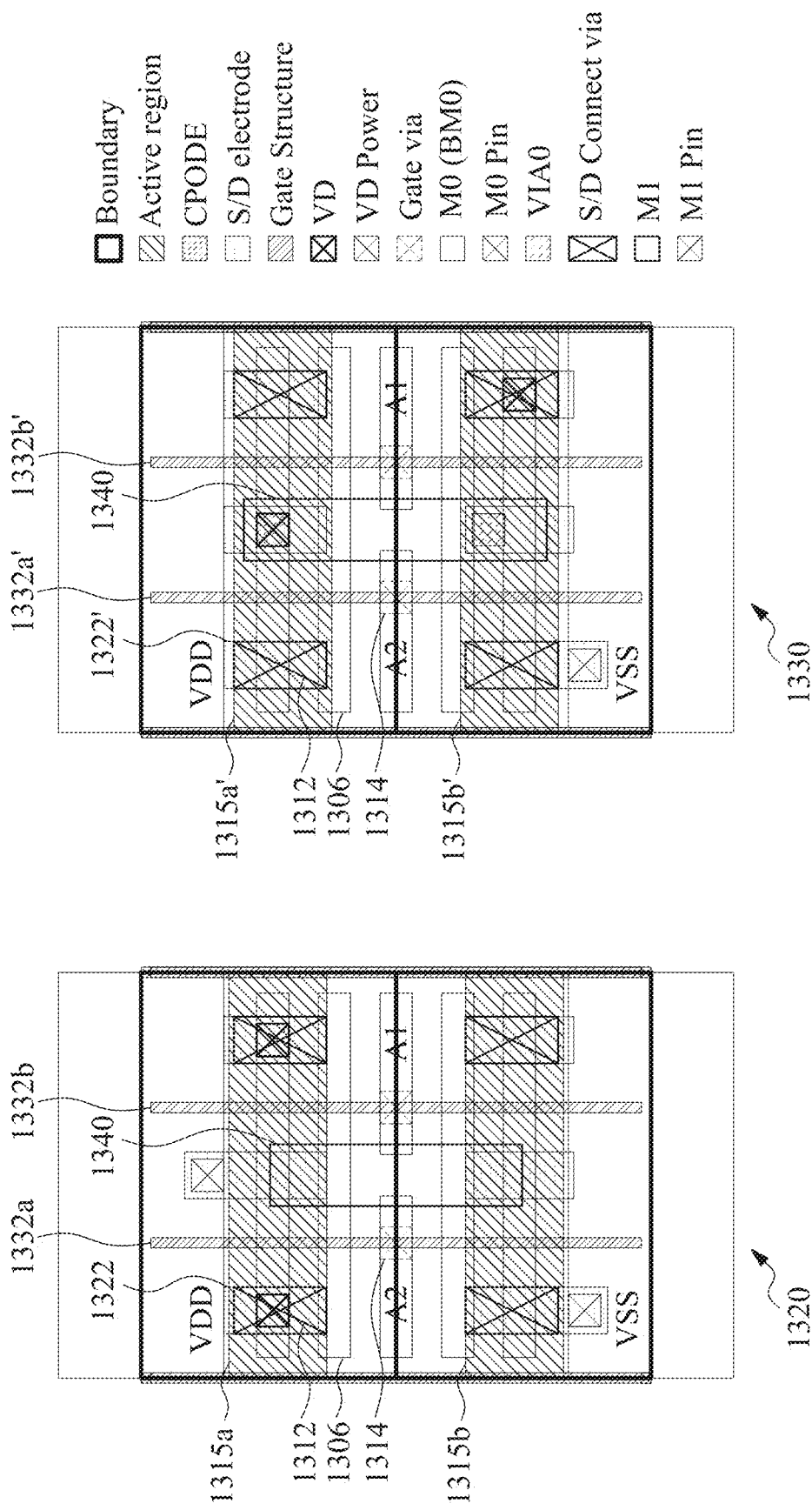
FIG. 13 is a view of a layout of an amphi-FET structure, in accordance with some embodiments.

An S/D connect via 1212 electrically connects the first S/D electrode 1222 to the second S/D electrode 1222' through the substrate. A gate via 1214 electrically connects the first gate structure 1232*a* to the third gate structure 1232*a'* through the substrate. One of ordinary skill in the art would understand that the components of the layout of the amphi-FET 1200 are formed using materials and processes described above, which are not repeated here for the sake of brevity FIG. 13 is a view of a layout of an amphi-FET structure 1300 in accordance with some embodiments. Less than all of the elements in the layout of the amphi-FET 1300 are labeled for the sake of clarity of the drawing. A legend is provided to assist with understanding of the different symbols in the layout of the amphi-FET 1300. The layout of the amphi-FET structure 1300 includes a layout of a first cell 1320 to be formed on a first side of a substrate; and a layout of a second cell 1330 to be formed on a second side of the substrate opposite to the first side.

The first cell 1320 includes a plurality of routing tracks 1306. The routing tracks 1306 are locations where conductive lines are able to be formed one level farther away from the substrate than the elements in the layout of the amphi-FET structure 1300. The first cell 1320 further includes a first active region 1315*a* and a second active region 1315*b* spaced from the first active region 1315*a*. In some embodiments, the first active region 1315*a* and the second active region 1315*b* include one or more NS. The first cell 1320 further includes a first S/D electrode 1322 associated with the first active region 1315*a*. The first cell 1320 further includes a first gate structure 1332*a* and a second gate structure 1332*b*, each of which are associated with both the first active region 1315*a* and the second active region 1315*b*.

The second cell 1330 includes the plurality of routing tracks 1306. The routing tracks 1306 are locations where conductive lines are able to be formed one level farther away from the substrate than the elements in the layout of the amphi-FET structure 1300. The second cell 1330 further includes a third active region 1315*a*' and a fourth active region 1315*b*' spaced from the third active region 1315*a*'. In some embodiments, the third active region 1315*a*' and the fourth active region 1315*b*' include one or more NS. The second cell 1330 further includes a second S/D electrode 1322' associated with the third active region 1315*a*'. The second cell 1330 further includes a third gate structure 1332*a*' and a fourth gate structure 1332*b*', each of which are associated with both the third active region 1315*a*' and the fourth active region 1315*b*'. The second cell 1330 further includes a connector 1340 electrically connecting an S/D electrode associated with the third active region 1315*a*' to an S/D electrode associated with the fourth active region 1315*b*'.

An S/D connect via 1312 electrically connects the first S/D electrode 1322 to the second S/D electrode 1322' through the substrate. A gate via 1314 electrically connects the first gate structure 1332*a* to the third gate structure 1332*a*' through the substrate. One of ordinary skill in the art would understand that the components of the layout of the amphi-FET 1300 are formed using materials and processes described above, which are not repeated here for the sake of brevity.

Figure 14:
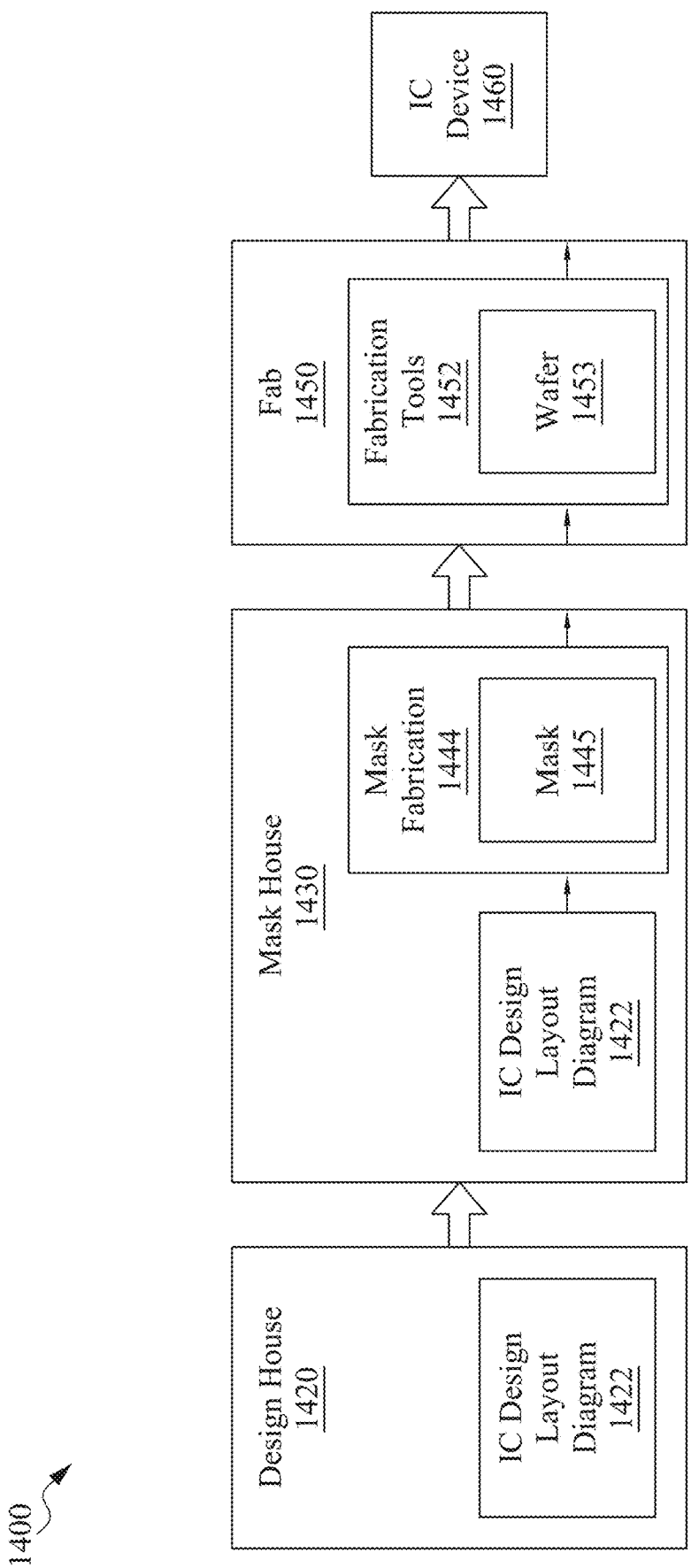
FIG. 14 is a block diagram of an integrated circuit (IC) manufacturing system, and an IC manufacturing flow associated therewith, in accordance with some embodiments.

FIG. 14 is a block diagram of an integrated circuit (IC) manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in IC manufacturing system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or a design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain region of the channel bar, source electrode, and drain electrode, metal lines or vias of an interlayer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes mask data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file (RDF). Mask data preparation 1432 provides the RDF to mask fabrication 1444. Mask fabrication 1444 includes a mask writer. A mask writer converts the RDF to an image on a substrate, such as a mask 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of mask data preparation 1432 has been simplified for the purposes of clarity. In some embodiments, mask data preparation 1432 includes additional features such as a logic operation (LOP) to modify the IC design layout diagram 1422 according to manufacturing rules. Additionally, the processes applied to IC design layout diagram 1422 during mask data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 includes fabrication tools 1452 configured to execute various manufacturing operations on semiconductor wafer 1453 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multi-level interconnects, and the like (formed at subsequent manufacturing steps).

FIG. 15 is a block diagram of an electronic design automation (EDA) system 1500 in accordance with some embodiments.

In some embodiments, EDA system 1500 includes an APR system. Methods described herein of designing layout diagrams represent wire routing arrangements, in accordance with one or more embodiments, are implementable, for example, using EDA system 1500, in accordance with some embodiments.

In some embodiments, EDA system 1500 is a general purpose computing device including a processor 1502 and a non-transitory, computer-readable storage medium 1504. Computer-readable storage medium 1504 is, amongst other things, encoded with, i.e., stores, computer program code 1506, i.e., a set of executable instructions. Execution of computer program code 1506 by processor 1502 represents (at least in part) an EDA tool which implements a portion or all of the methods described herein in accordance with one or more embodiments (hereinafter, the noted processes and/or methods).

Processor 1502 is electrically coupled to computer-readable storage medium 1504 via a bus 1508. Processor 1502 is also electrically coupled to an I/O interface 1510 by bus 1508. A network interface 1512 is also electrically connected to processor 1502 via bus 1508. Network interface 1512 is connected to a network 1514, so that processor 1502 and computer-readable storage medium 1504 are capable of connecting to external elements via network 1514. Processor 1502 is configured to execute computer program code 1506 encoded in computer-readable storage medium 1504 in order to cause EDA system 1500 to be usable for performing a portion or all of the noted processes and/or methods. In one or more embodiments, processor 1502 is a central processing unit (CPU), a multi-processor, a distributed processing system, an application specific integrated circuit (ASIC), and/or a suitable processing unit.

In one or more embodiments, computer-readable storage medium 1504 is an electronic, magnetic, optical, electromagnetic, infrared, and/or a semiconductor system (or apparatus or device). For example, computer-readable storage medium 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1504 includes a compact disk-read only memory (CD-ROM), a compact disk-read/write (CD-R/W), and/or a digital video disc (DVD).

In one or more embodiments, storage medium 1504 stores computer program code 1506 configured to cause EDA system 1500 (where such execution represents (at least in part) the EDA tool) to be usable for performing a portion or all of the noted processes and/or methods. In one or more embodiments, storage medium 1504 also stores information which facilitates performing a portion or all of the noted processes and/or methods. In one or more embodiments, storage medium 1504 stores library 1507 of standard cells including such standard cells as disclosed herein.

EDA system 1500 includes I/O interface 1510. I/O interface 1510 is coupled to external circuitry. In one or more embodiments, I/O interface 1510 includes a keyboard, keypad, mouse, trackball, trackpad, touchscreen, and/or cursor direction keys for communicating information and commands to processor 1502.

EDA system 1500 also includes network interface 1512 coupled to processor 1502. Network interface 1512 allows EDA system 1500 to communicate with network 1514, to which one or more other computer systems are connected. Network interface 1512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1500.

EDA system 1500 is configured to receive information through I/O interface 1510. The information received through I/O interface 1510 includes one or more of instructions, data, design rules, libraries of standard cells, and/or other parameters for processing by processor 1502. The information is transferred to processor 1502 via bus 1508. EDA system 1500 is configured to receive information related to a UI through I/O interface 1510. The information is stored in storage medium 1504 as user interface (UI) 1542.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1500. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Details regarding an integrated circuit (IC) manufacturing system (e.g., EDA system 1500 of FIG. 15), and an IC manufacturing flow associated therewith are found, e.g., in U.S. Pat. No. 9,256,709, granted Feb. 9, 2016, U.S. Pre-Grant Publication No. 20178429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of this description relates to a method of making a semiconductor device. The method includes forming a first active region on a first side of a substrate. The method further includes forming a first source/drain (S/D) electrode surrounding a first portion of the first active region. The method further includes forming an S/D connect via extending through the substrate. The method further includes flipping the substrate. The method further includes forming a second active region on a second side of the substrate, wherein the second side of the substrate is opposite to the first side of the substrate. The method further includes forming a second S/D electrode surrounding a first portion of the second active region, wherein the S/D connect directly contacts both the first S/D electrode and the second S/D electrode. In some embodiments, the method further includes forming a first gate structure surrounding a second portion of the first active region; forming a second gate structure surrounding a second portion of the second active region; and forming a gate via extending through the substrate, wherein the gate via directly contacts both the first gate structure and the second gate structure. In some embodiments, forming the S/D connect via occurs prior to forming the first S/D electrode and prior to forming the second S/D electrode. In some embodiments, forming the S/D connect via occurs after forming the first S/D electrode. In some embodiments, flipping the substrate occurs prior to forming the S/D connect via. In some embodiments, forming the S/D connect via includes forming the S/D connect via having a same width parallel to the first side of the substrate as a width of the first S/D electrode.

An aspect of this description relates to a method of designing a semiconductor device. The method includes receiving a layout of a device, wherein the device is designed to be formed on a single side of a substrate, and the layout comprises a plurality of routing tracks. The method further includes cutting the layout along a first direction, wherein the first direction is parallel to the plurality of routing tracks or perpendicular to the plurality of routing tracks. The method further includes dividing the cut layout into a first cell and a second cell based on a location of the cutting, wherein the first cell includes a first gate structure, and the second cell includes a second gate structure. The method further includes inserting a gate via into the first cell or the second cell, wherein the gate via is positioned to directly connect to the first gate structure and to directly connect to the second gate structure. In some embodiments, the first direction is parallel to the plurality of routing tracks. In some embodiments, the first direction is perpendicular to the plurality of routing tracks. In some embodiments, the method further includes positioning the first cell on a first side of the substrate; and positioning the second cell on a second side of the substrate, wherein the second side of the substrate is opposite to the first side of the substrate. In some embodiments, the method further includes inserting a source/drain (S/D) via into the first cell or the second cell, wherein the S/D via directly connects to a first S/D region in the first cell and directly connects to a second S/D region in the second cell. In some embodiments, the method further includes instructing fabrication tools to manufacture the semiconductor device following the inserting the gate via.

An aspect of this description relates to a method of making a semiconductor device. The method includes forming a first electrode surrounding a first portion of a first active region on a first side of a substrate. The method further includes forming a second electrode surrounding a second portion of a second active region on a second side of the substrate. The method further includes forming a through substrate via extending through the substrate, wherein the through substrate via directly contacts both the first electrode and the second electrode. In some embodiments, forming the first electrode includes forming a source/drain (S/D) electrode. In some embodiments, forming the first electrode includes forming a gate electrode. In some embodiments, forming the through substrate via includes forming the through substrate via having a same width, measured parallel to the first side of the substrate, as at least one of the first electrode or the second electrode. In some embodiments, forming the through substrate via includes forming the through substrate via having a smaller width, measured parallel to the first side of the substrate, than both the first electrode and the second electrode. In some embodiments, the method further includes forming a third electrode surrounding a third portion of the first active region; and forming a fourth electrode surrounding a fourth portion of the second active region. In some embodiments, the method further includes forming a second through substrate via extending through the substrate, wherein the second through substrate via directly connects to the third electrode and the fourth electrode. In some embodiments, forming the second through substrate via includes forming the second through substrate via offset from the through substrate via in a first direction parallel to the first side of the substrate, and offset from the through substrate via in a second direction perpendicular to a longitudinal direction of the first active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, the method comprising:
   forming a first active region on a first side of a substrate;
   forming a first source/drain (S/D) electrode surrounding a first portion of the first active region;
   forming an S/D connect via extending through the substrate;
   flipping the substrate;
   forming a second active region on a second side of the substrate, wherein the second side of the substrate is opposite to the first side of the substrate; and
   forming a second S/D electrode surrounding a first portion of the second active region, wherein the S/D connect directly contacts both the first S/D electrode and the second S/D electrode.

2. The method of claim 1, further comprising:
   forming a first gate structure surrounding a second portion of the first active region;
   forming a second gate structure surrounding a second portion of the second active region; and
   forming a gate via extending through the substrate, wherein the gate via directly contacts both the first gate structure and the second gate structure.

3. The method of claim 1, wherein forming the S/D connect via occurs prior to forming the first S/D electrode and prior to forming the second S/D electrode.

4. The method of claim 1, wherein forming the S/D connect via occurs after forming the first S/D electrode.

5. The method of claim 1, wherein flipping the substrate occurs prior to forming the S/D connect via.

6. The method of claim 1, wherein forming the S/D connect via comprises forming the S/D connect via having a same width parallel to the first side of the substrate as a width of the first S/D electrode.

7. A method of designing a semiconductor device, the method comprising:
   receiving a layout of a device, wherein the device is designed to be formed on a single side of a substrate, and the layout comprises a plurality of routing tracks;
   cutting the layout along a first direction, wherein the first direction is parallel to the plurality of routing tracks or perpendicular to the plurality of routing tracks;
   dividing the cut layout into a first cell and a second cell based on a location of the cutting, wherein the first cell comprises a first gate structure, and the second cell comprises a second gate structure; and
   inserting a gate via into the first cell or the second cell, wherein the gate via is positioned to directly connect to the first gate structure and to directly connect to the second gate structure.

8. The method of claim 7, wherein the first direction is parallel to the plurality of routing tracks.

9. The method of claim 7, wherein the first direction is perpendicular to the plurality of routing tracks.

10. The method of claim 7, further comprising:
    positioning the first cell on a first side of the substrate; and
    positioning the second cell on a second side of the substrate, wherein the second side of the substrate is opposite to the first side of the substrate.

11. The method of claim 7, further comprising inserting a source/drain (S/D) via into the first cell or the second cell, wherein the S/D via directly connects to a first S/D region in the first cell and directly connects to a second S/D region in the second cell.

12. The method of claim 7, further comprising instructing fabrication tools to manufacture the semiconductor device following the inserting the gate via.

13. A method of making a semiconductor device, the method comprising:
    forming a first electrode surrounding a first portion of a first active region on a first side of a substrate;
    forming a second electrode surrounding a second portion of a second active region on a second side of the substrate; and forming a through substrate via extending through the substrate, wherein the through substrate via directly contacts both the first electrode and the second electrode.

14. The method of claim 13, wherein forming the first electrode comprises forming a source/drain (S/D) electrode.

15. The method of claim 13, wherein forming the first electrode comprises forming a gate electrode.

16. The method of claim 13, wherein forming the through substrate via comprises forming the through substrate via having a same width, measured parallel to the first side of the substrate, as at least one of the first electrode or the second electrode.

17. The method of claim 13, wherein forming the through substrate via comprises forming the through substrate via having a smaller width, measured parallel to the first side of the substrate, than both the first electrode and the second electrode.

18. The method of claim 13, further comprising:

forming a third electrode surrounding a third portion of the first active region; and forming a fourth electrode surrounding a fourth portion of the second active region.

19. The method of claim 18, further comprising forming a second through substrate via extending through the substrate, wherein the second through substrate via directly connects to the third electrode and the fourth electrode.

20. The method of claim 19, wherein forming the second through substrate via comprises forming the second through substrate via offset from the through substrate via in a first direction parallel to the first side of the substrate, and offset from the through substrate via in a second direction perpendicular to a longitudinal direction of the first active region.

* * * * *